(12) United States Patent
Weaver et al.

(10) Patent No.: US 11,264,258 B2
(45) Date of Patent: Mar. 1, 2022

(54) BUFFER CHAMBER WAFER HEATING MECHANISM AND SUPPORTING ROBOTS

(71) Applicant: Applied Materials, Inc., Santa Clara, CA (US)

(72) Inventors: William T. Weaver, Austin, TX (US); Jason M. Schaller, Austin, TX (US); Robert Brent Vopat, Austin, TX (US); David Blahnik, Round Rock, TX (US); Benjamin B. Riordon, Newburyport, MA (US); Paul E. Pergande, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/877,641

(22) Filed: May 19, 2020

(65) Prior Publication Data

US 2020/0279763 A1 Sep. 3, 2020

Related U.S. Application Data

(63) Continuation of application No. 16/127,702, filed on Sep. 11, 2018, now Pat. No. 10,699,930, which is a continuation of application No. 15/099,760, filed on Apr. 15, 2016, now Pat. No. 10,103,046.

(60) Provisional application No. 62/150,271, filed on Apr. 20, 2015.

(51) Int. Cl.
*H01L 21/677* (2006.01)
*H01L 21/67* (2006.01)
*H01L 21/687* (2006.01)

(52) U.S. Cl.
CPC .... *H01L 21/67754* (2013.01); *H01L 21/6719* (2013.01); *H01L 21/67109* (2013.01); *H01L 21/67115* (2013.01); *H01L 21/67196* (2013.01); *H01L 21/67742* (2013.01);
(Continued)

(58) Field of Classification Search
CPC ........ H01L 21/68785; H01L 21/68764; H01L 21/67745; H01L 21/67742; H01L 21/67754
See application file for complete search history.

(56) References Cited

U.S. PATENT DOCUMENTS

| | | |
|---|---|---|
| 5,466,114 A | 11/1995 | Swain |
| 5,855,465 A | 1/1999 | Boitnott et al. |
| 5,863,170 A | 1/1999 | Boitnott et al. |

(Continued)

FOREIGN PATENT DOCUMENTS

| | | |
|---|---|---|
| WO | 99/18603 A1 | 4/1999 |
| WO | 99/28951 | 6/1999 |
| WO | 00/30155 | 5/2000 |

OTHER PUBLICATIONS

PCT International Preliminary Report on Patentability in PCT/US2016/027720 dated Nov. 2, 2017, 9 pages.

(Continued)

*Primary Examiner* — Kaitlin S Joerger
(74) *Attorney, Agent, or Firm* — Servilla Whitney LLC

(57) ABSTRACT

Buffer chamber including robots, a carousel and at least one heating module for use with a batch processing chamber are described. Robot configurations for rapid and repeatable movement of wafers into and out of the buffer chamber and cluster tools incorporating the buffer chambers and robots are described.

11 Claims, 23 Drawing Sheets

(52) U.S. Cl.
CPC .. *H01L 21/67745* (2013.01); *H01L 21/68764* (2013.01); *H01L 21/68771* (2013.01)

(56) References Cited

U.S. PATENT DOCUMENTS

| | | | | |
|---|---|---|---|---|
| 5,951,770 | A * | 9/1999 | Perlov | H01L 21/67196 118/719 |
| 5,981,399 | A | 11/1999 | Kawamura et al. | |
| 6,071,055 | A | 6/2000 | Tepman | |
| 6,106,634 | A | 8/2000 | Ghanayem et al. | |
| 6,192,601 | B1 | 2/2001 | Ghanayem et al. | |
| 6,315,512 | B1 | 11/2001 | Tabrizi et al. | |
| 6,395,094 | B1 | 5/2002 | Tanaka et al. | |
| 6,468,353 | B1 | 10/2002 | Perlov et al. | |
| 6,517,691 | B1 | 2/2003 | Bluck et al. | |
| 6,547,510 | B1 * | 4/2003 | Beaulieu | B23H 9/06 414/744.5 |
| 7,006,888 | B2 | 2/2006 | Wang et al. | |
| 7,144,813 | B2 | 12/2006 | Wirth et al. | |
| 7,695,233 | B2 | 4/2010 | Toshima | |
| 7,723,709 | B2 | 5/2010 | Zama | |
| 7,874,781 | B2 * | 1/2011 | Nozawa | H01L 21/67742 414/217 |
| 7,946,800 | B2 * | 5/2011 | Hosek | H01L 21/67742 414/744.5 |
| 8,016,542 | B2 * | 9/2011 | Cox | H01L 21/67742 414/744.5 |
| 8,029,226 | B2 | 10/2011 | Van Der Meulen | |
| 8,500,388 | B2 | 8/2013 | Van Der Meulen et al. | |
| 8,523,507 | B2 | 9/2013 | Van Der Meulen | |
| 8,752,449 | B2 * | 6/2014 | Hofmeister | B25J 9/126 74/490.01 |
| 8,807,905 | B2 * | 8/2014 | Meulen | H01L 21/67196 414/217 |
| 8,950,998 | B2 * | 2/2015 | Meulen | B65G 37/00 414/217 |
| 9,033,644 | B2 * | 5/2015 | Hudgens | B25J 18/00 414/744.5 |
| 9,174,346 | B2 * | 11/2015 | Ando | B25J 18/04 |
| 9,202,733 | B2 * | 12/2015 | Hosek | H01L 21/67742 |
| 9,248,568 | B2 * | 2/2016 | Caveney | H01L 21/67766 |
| 9,441,792 | B2 | 9/2016 | Ng | |
| 9,457,464 | B2 | 10/2016 | Kremerman et al. | |
| 9,623,555 | B2 * | 4/2017 | Krupyshev | B25J 9/043 |
| 9,852,935 | B2 * | 12/2017 | Caveney | B25J 9/043 |
| 10,052,756 | B2 * | 8/2018 | Kuribayashi | H01L 21/67766 |
| 10,103,046 | B2 * | 10/2018 | Weaver | H01L 21/67115 |
| 10,325,795 | B2 * | 6/2019 | Caveney | B25J 9/043 |
| 10,406,479 | B2 | 9/2019 | Caveney et al. | |
| 10,406,679 | B2 * | 9/2019 | Caveney | H01L 21/67766 |
| 10,427,303 | B2 * | 10/2019 | Weaver | H01L 21/67161 |
| 2003/0113188 | A1 | 6/2003 | Pool | |
| 2003/0133773 | A1 | 7/2003 | Wang et al. | |
| 2004/0091349 | A1 | 5/2004 | Tabrizi et al. | |
| 2005/0063800 | A1 | 3/2005 | Kurita et al. | |
| 2005/0111956 | A1 * | 5/2005 | van der Meulen | H01L 21/67736 414/744.2 |
| 2006/0156979 | A1 | 7/2006 | Thakur et al. | |
| 2007/0057352 | A1 | 3/2007 | Wirth et al. | |
| 2007/0207014 | A1 | 9/2007 | Toshima | |
| 2007/0264106 | A1 * | 11/2007 | van der Meulen | H01L 21/6719 414/217 |
| 2008/0131237 | A1 | 6/2008 | van der Meulen | |
| 2008/0171435 | A1 | 7/2008 | Fujii et al. | |
| 2008/0187417 | A1 | 8/2008 | van der Meulen et al. | |
| 2008/0187418 | A1 | 8/2008 | van der Meulen et al. | |
| 2008/0226429 | A1 | 9/2008 | van der Meulen | |
| 2008/0232933 | A1 | 9/2008 | Kiley | |
| 2008/0232948 | A1 | 9/2008 | van der Meulen et al. | |
| 2009/0087286 | A1 | 4/2009 | van der Meulen | |
| 2010/0162955 | A1 | 7/2010 | Lei et al. | |
| 2010/0173495 | A1 | 7/2010 | Thakur et al. | |
| 2011/0121207 | A1 | 5/2011 | Brailove | |
| 2012/0014769 | A1 | 1/2012 | Van Der Meulen | |
| 2012/0210937 | A1 | 8/2012 | Thakur et al. | |
| 2014/0271083 | A1 | 9/2014 | Caveney | |
| 2015/0128749 | A1 * | 5/2015 | Gilchrist | B25J 18/04 74/490.04 |
| 2018/0019155 | A1 * | 1/2018 | Tsang | H01L 21/67742 |
| 2018/0082881 | A1 * | 3/2018 | Nagakubo | H01L 21/67742 |
| 2018/0108561 | A1 * | 4/2018 | Hosek | H01L 21/67742 |
| 2019/0172746 | A1 * | 6/2019 | Caveney | H01L 21/68707 |
| 2019/0206710 | A1 * | 7/2019 | Lei | H01L 21/67754 |

OTHER PUBLICATIONS

PCT International Search Report and Written Opinion in PCT/US2016/027720, dated Jun. 30, 2016, 12 pgs.

* cited by examiner

# BUFFER CHAMBER WAFER HEATING MECHANISM AND SUPPORTING ROBOTS

CROSS-REFERENCE TO RELATED APPLICATIONS

This application is a Continuation of U.S. patent application Ser. No. 16/127,702, filed Sep. 11, 2018, which is a continuation of U.S. patent application Ser. No. 15/099,760, filed Apr. 15, 2016, issued as U.S. Pat. No. 10,103,046 on Oct. 16, 2018, which claims priority to U.S. Provisional Application No. 62/150,271, filed Apr. 20, 2015, the entire disclosures of which are hereby incorporated by reference herein.

TECHNICAL FIELD

Embodiments of the disclosure relate generally to methods and apparatus to preheat wafers in a cluster tool configuration without significantly impacting system throughput. In particular, embodiments of the disclosure are directed to apparatus and methods to rapidly and efficiently preheat wafers including robot mechanisms to rapidly and efficiently move wafers from a preheating buffer chamber to a processing chamber.

BACKGROUND

The batch ALD platforms have a wide range of applications with various requirements and constraints that demands a flexible architecture. Platform requirements include wafer preheating, post cooling, preheat & post cool, throughput from 30 wph to 270 wph, high vacuum loadlocks, and numerous other specifications. With the numerous parameters and individual apparatus that make up the platform, it can be challenging to provide functionality with low entitlement cost.

Some ALD platforms currently provide standard and active wafer cooling capable loadlocks. The high temperature processes (>450° C.) require the wafer be preheated prior to being placed on the process chamber susceptor. In a conventional system, a room temperature wafer preheated in the process chamber for as long as 3 minutes. This cost valuable processing time and significantly reduces system throughput for shorter processes.

Current products employ numerous methods to heat single wafers either in a loadlock or a separate process chamber. However, when using a batch ALD platform with, for example, six wafers, heating single wafers in a separate chamber or loadlock would not provide sufficient throughput. Single wafer loadlock cycles are too slow to the meet the wafer exchange budget. Additionally, the transfer chambers used with batch processing chambers may not have another facet for a heating chamber. Even if another facet were available, vacuum robots cannot produce satisfactory throughput with the additional handoff location. Accordingly, there is a need in the art for apparatus and methods of preheating wafers for batch processing including robots capable of producing the sufficient throughput.

SUMMARY

One or more embodiments of the disclosure are directed to buffer chambers comprising a housing with a carousel. The housing has a lid, a floor and at least one sidewall having at least two facets. Each of the facets includes a slit valve sized to allow a wafer to pass therethrough. The carousel includes a wafer support having at least two wafer support positions. At least one heating module to heat a wafer when supported by the wafer support. A wafer transfer robot is below the carousel to move a wafer between one or more areas and at least one of the wafer support positions. A motor is connected to the carousel to index the carousel so that at least one support position is aligned with a slit valve in one of the facets.

Additional embodiments of the disclosure are directed to wafer transfer robots comprising: an L-shaped boom having a first leg with a first end, a second leg with a second end, the first leg and second leg connected at an angled portion; an armset attached to each of the first end and second send of the boom, each armset having a lower arm attached to the boom at a shoulder adjacent the first end or second end, an upper arm attached to the lower arm at an elbow and a blade attached to the upper arm at a wrist; and a pulley which causes the shoulder, elbow and wrist to extend substantially simultaneously so that the blade remains parallel to the leg during extension.

Further embodiments of the disclosure are directed to wafer transfer robots comprising: an L-shaped boom having a first leg with a first end, a second leg with a second end, the first leg and second leg connected at an angled portion; an armset attached to each of the first end and second send of the boom, each armset having a lower arm attached to the boom at a shoulder adjacent the first end or second end, an upper arm attached to the lower arm at an elbow and a blade attached to the upper arm at a wrist; and a pulley which causes the shoulder, elbow and wrist to extend substantially simultaneously so that the blade remains parallel to the leg during extension. The transfer robot is a long armset robot on a short boom so that the combined length of the armset from should to an end of the blade has a length that is greater than about 2.5 times a length from a pivot point in the angled portion of the boom to the shoulder.

Additional embodiments of the disclosure are directed to wafer transfer robots comprising: an I-shaped boom having a first end, a second end and a pivot point; an armset attached to each of the first end and second send of the boom, each armset having a lower arm attached to the boom at a shoulder adjacent the first end or second end, an upper arm attached to the lower arm at an elbow and a blade attached to the upper arm at a wrist; and a pulley which causes the shoulder, elbow and wrist to extend substantially simultaneously so that the blade remains parallel to the leg during extension. The transfer robot is a long armset robot on a short boom so that the combined length of the armset from should to an end of the blade has a length that is greater than about 2.5 times a length from a pivot point in the angled portion of the boom to the shoulder, and the boom is positioned at an angle in the range of about 30° to about 60° relative to a major axis of the movement of the blades.

Some embodiments of the disclosure are directed to wafer transfer robots comprising: a rotatable base; a first armset comprising a first lower arm connected to the base at a first shoulder, a first upper arm connected to the first lower arm at a first elbow, a first blade connected the first upper arm at a first wrist, the first blade having a first inner blade portion extending a first length from the first wrist to a first lower corner, a first intermediate blade portion extending perpendicularly from the first inner blade portion to a first upper corner and a first outer blade portion extending perpendicular to the first intermediate blade portion in a direction away from and parallel to the first inner blade portion; and a second armset comprising a second lower arm connected to the base at a second shoulder, a second upper arm connected to the second lower arm at a second elbow, a second blade connected to the second upper arm at a second wrist, the second blade having a second inner blade portion extending a second length from the second wrist to a second lower corner, a second intermediate blade portion extending perpendicularly from the second inner blade portion to a second upper corner and a second outer blade portion extending perpendicularly to the second intermediate blade portion in a direction away from and parallel to the second inner blade portion. The first length is greater than the second length and the first outer blade portion and the second outer blade portion can support wafers substantially coplanarly, and the second armset cannot extend until the first armset has extended and the first armset cannot retract until the second armset has retracted.

One or more embodiments of the disclosure are directed to wafer transfer robots comprising: a rotatable boom having an I-shape with a first end and a second end; a first armset comprising a first lower arm connected to the boom at a first shoulder at the first end of the boom, a first upper arm connected to the first lower arm at a first elbow, a first blade connected the first upper arm at a first wrist, the first blade having a first inner blade portion extending a first length from the first wrist to a first lower corner, a first intermediate blade portion extending perpendicularly from the first inner blade portion to a first upper corner and a first outer blade portion extending perpendicular to the first intermediate blade portion in a direction away from and parallel to the first inner blade portion; and a second armset comprising a second lower arm connected to the boom at a second shoulder at the second end of the boom, a second upper arm connected to the second lower arm at a second elbow, a second blade connected to the second upper arm at a second wrist, the second blade having a second inner blade portion extending a second length from the second wrist to a second lower corner, a second angled blade portion extending at an angle to and along the plane of the second inner blade portion, a second intermediate blade portion extending perpendicularly from the second angled blade portion to a second upper corner and a second outer blade portion extending in a plane perpendicular to the second intermediate blade portion in a direction away from, parallel to and offset from the second inner blade portion. When in the retracted position, the second outer blade portion is above the first inner blade portion and the first outer blade portion is above and offset from the second inner blade portion, and the first outer blade portion and the second outer blade portions are substantially coplanar.

Further embodiments of the disclosure are directed to cluster tools comprising a buffer chamber as described herein having four facets. A first batch processing chamber is connected to one of the four facets. A second batch processing chamber is connected to a second of the four facets, next to the first of the four facets. A first loading station and a second loading station are attached to the third facet and fourth facet of the buffer chamber. Each of the first batch processing chamber and the second batch processing chamber can process n wafers at the same time and the buffer chamber has a carousel with n+1 or n+2 support positions.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
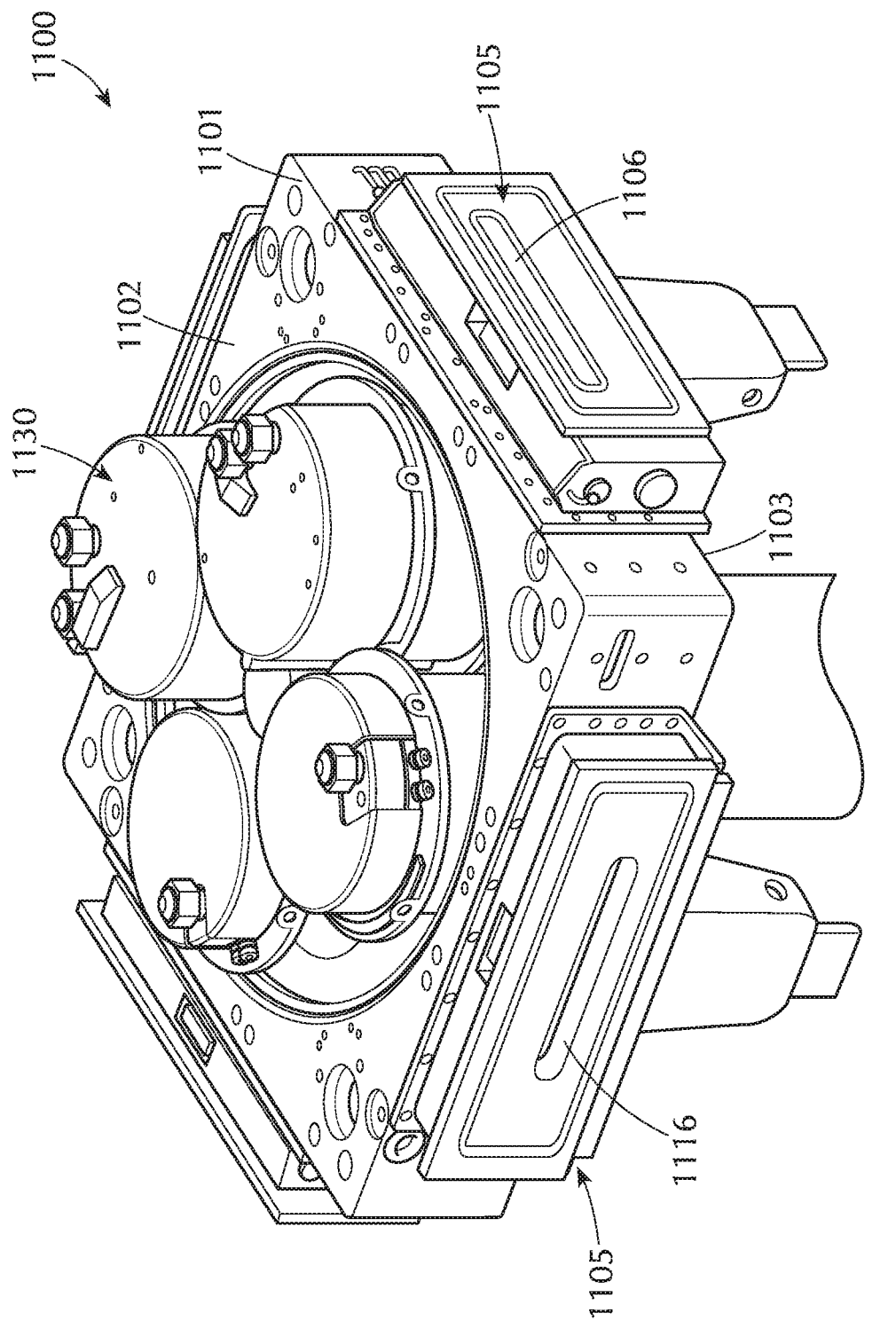
FIG. 1 shows a buffer chamber in accordance with one or more embodiment of the disclosure.
Figure 2:
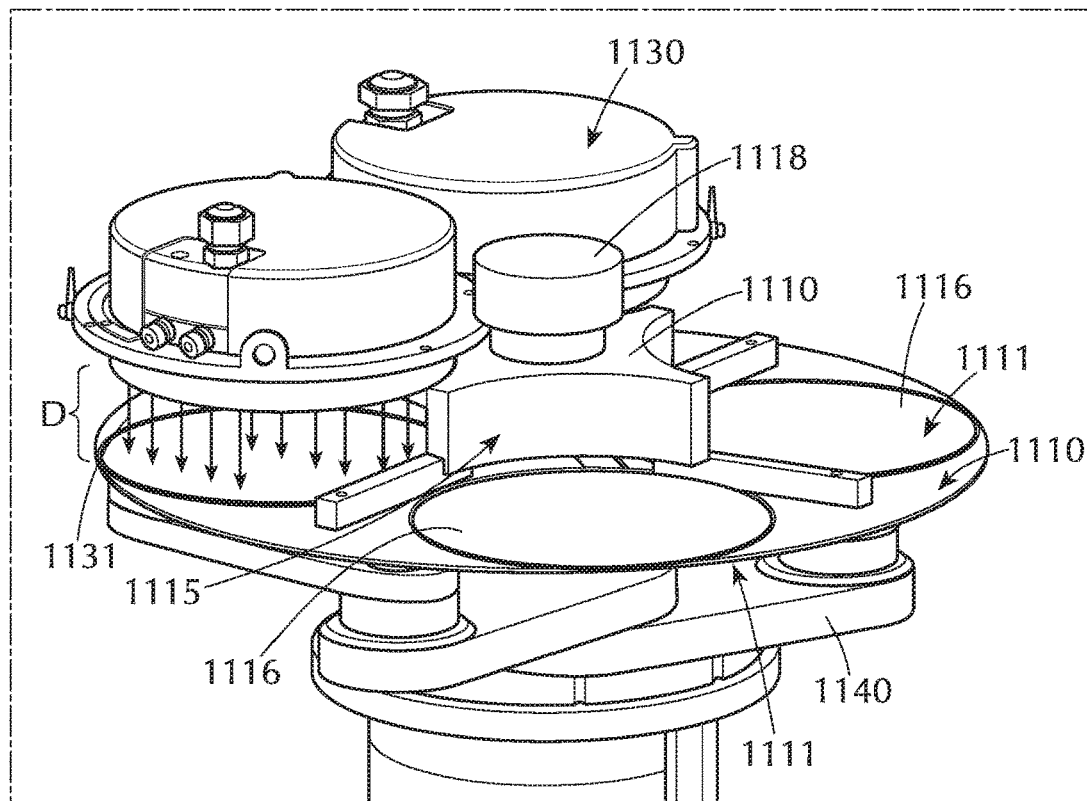
FIG. 2 shows an inner portion of a buffer chamber in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure are directed to apparatus and methods for preheating wafers on an ALD platform using a buffer chamber. Preheating in the buffer chamber can be accomplished using an internal carousel mechanism that positions wafers for heating while a wafer transfer robot simultaneously transfers other wafers in the carousel to the process chamber and loadlocks.

FIGS. 1 through 5 show a buffer chamber in accordance with one or more embodiments of the disclosure. The embodiments shown are merely exemplary and should not be taken as limiting the scope of the disclosure. A buffer chamber 1100 includes a housing 1101 with a lid 1102, a floor 1103 and a sidewall 1104. The sidewall has a number of facets 1105 which can be used to form a connection with various chambers and processing equipment. The buffer chamber 1100 has at least two facets 1105 so that at least two components can be connected to the buffer chamber 1100. The embodiment shown in the drawings has four facets 1105, but those skilled in the art will understand that this is merely one possible configuration. In one or more embodiments, there are two, three, four, five, six, seven, eight, nine or ten facets.

Figure 3:
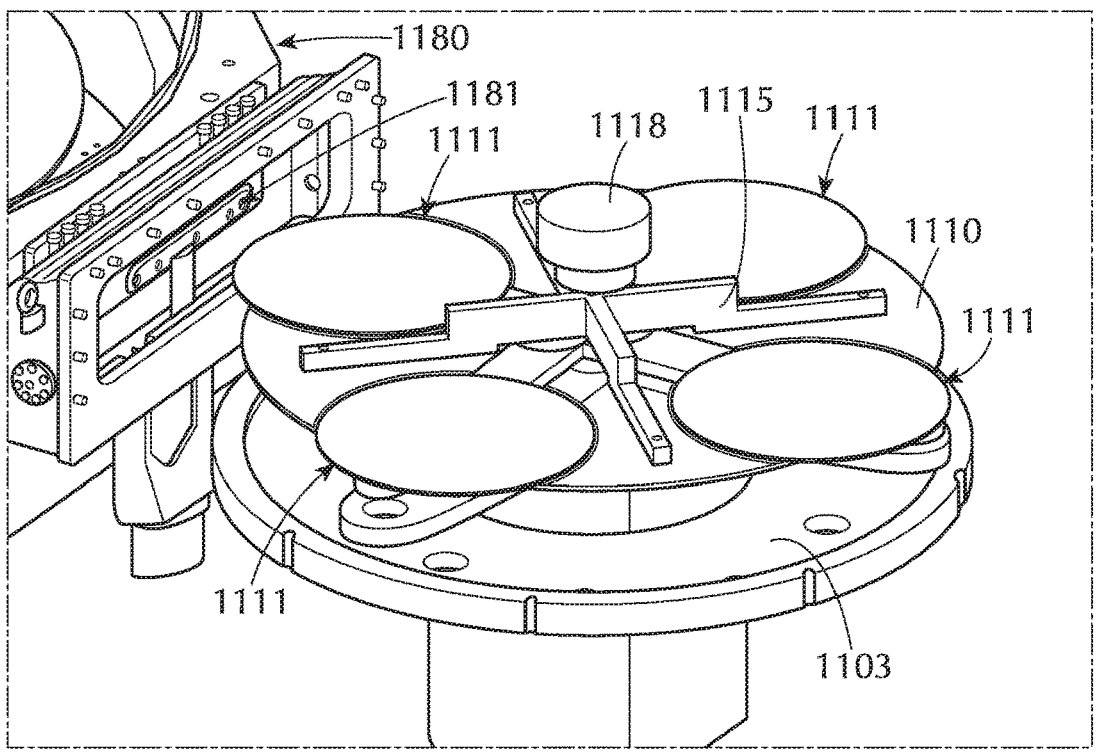
FIG. 3 shows an inner portion of a buffer chamber in accordance with one or more embodiment of the disclosure.
Figure 4:
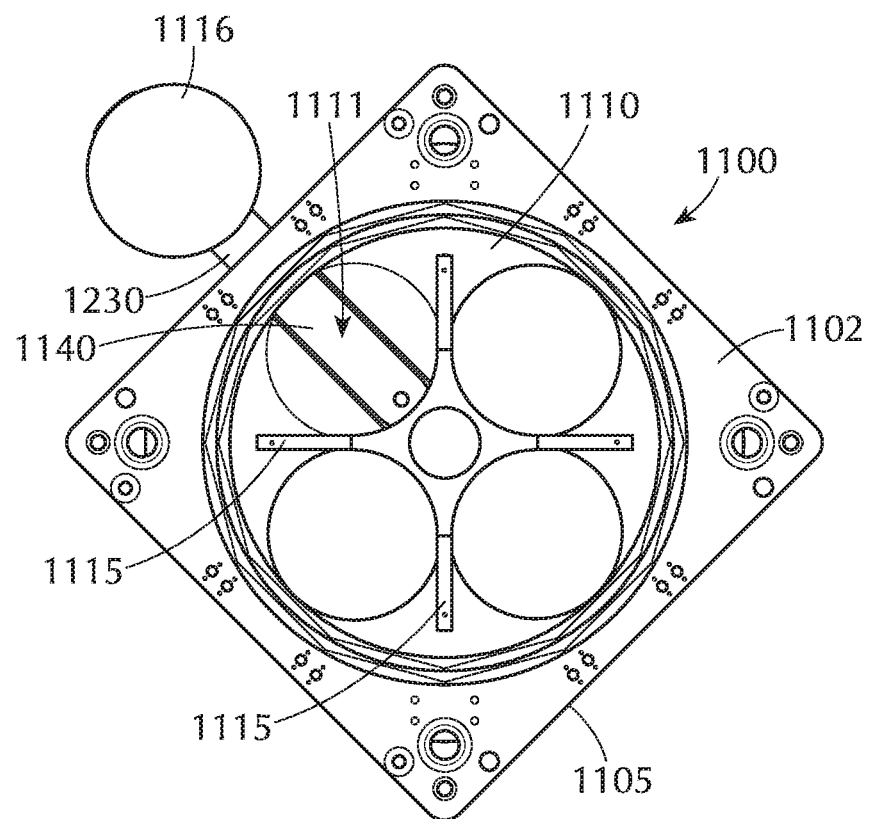
FIG. 4 shows a top view of a buffer chamber in accordance with one or more embodiment of the disclosure.
Figure 5:
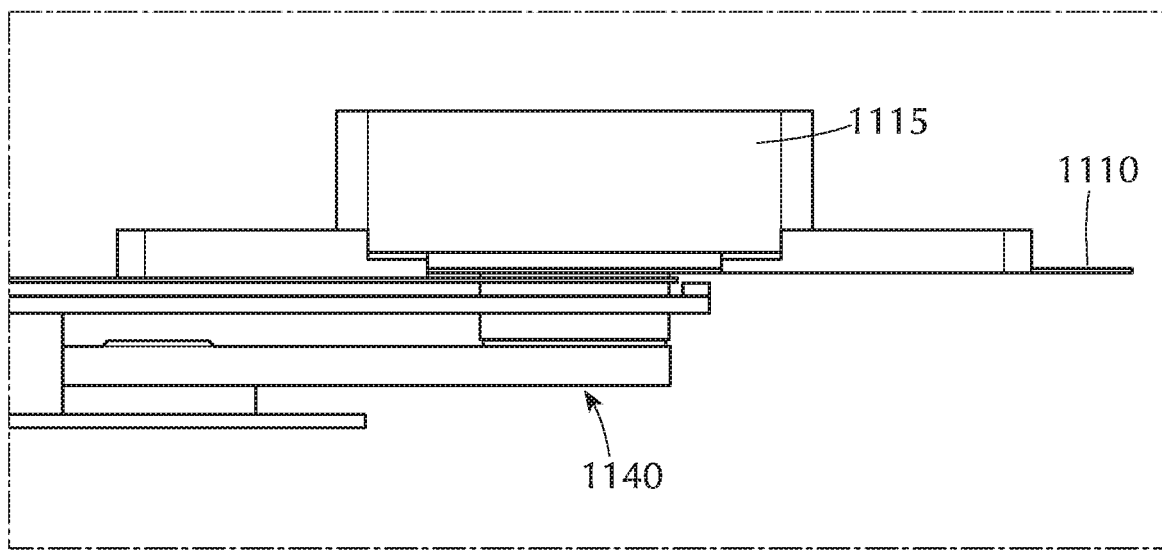
FIG. 5 shows a side view of a robot and carousel in a buffer chamber in accordance with one or more embodiment of the disclosure.

Each of the facets 1105 has a slit valve 1106 that is sized to allow at least a wafer to pass therethrough. In some embodiments the slit valve 1106 is sized to allow a wafer and a robot blade to pass through. FIG. 3 shows a batch processing chamber 1180 with a separate slit valve 1181 that can be positioned adjacent the slit valve of the buffer chamber 1100. In some embodiments, each of the facets has a slit valve. In one or more embodiments, there are two, three, four, five, six, seven, eight, nine, ten or more slit valves. In some embodiments, there are more slit valves than facets, allowing for more than one slit valve on any given facet. In some embodiments, there are four slit valves which allow access to four sides of the housing. In one or more embodiments, two of the four slit valves are aligned with batch processing chambers.

The buffer chamber 1100 includes a carousel 1110 with at least two wafer support positions 1111. The carousel 1110 can be connected to the lid 1102 of the housing 1101 or the floor 1103 of the housing 1101. The carousel 1110 can have any suitable number of wafer support positions 1111 depending on, for example, the length of time for preheating and the number of wafers that can be processed at the same time in a connected batch processing chamber 1180. The carousel 1110 shown in FIGS. 1-5 includes four wafer support positions 1111, however, more or less can be included. In some embodiments, the carousel 1110 comprises in the range of 2 and 12 wafer support positions, or in the range of 3 and 10 wafer support positions 1111, or in the range of 4 and 8 wafer support positions 1111.

In some embodiments, each of the wafer support positions 1111 are separated from adjacent support positions by a wall 1115. The wall 1115 may help provide isolation between support positions 1111 that are indexed beneath a heat source and support positions that are not under a heat source. In some embodiments, the carousel 1110 comprises two, three, four, five, six, seven, eight, nine, 10, 11, 12, 13, 14, 15, 16 or more support positions. In one or more embodiments, the carousel comprises 7 or 8 support positions and the housing is connected to one or two batch processing chambers that can process six wafers at the same time.

The carousel 1110 may hang from the lid of the buffer chamber 1100 directly above a robot 1140. A feedthrough 1112 (see FIG. 6A) may be incorporated that has acceptable particle performance (e.g., ferrofluidic, airbearing). The feedthrough 1112 may allow for rotary motion of the carousel 1110 while forming a passthrough for any cables or fluids.

A heating module 1130 is positioned above at least some of the wafer support positions 1111 corresponding to a carousel index position. A carousel index position is any position where at least one wafer support position 1111 is located adjacent a slit valve 1106. The heating module 1130 can be any suitable wafer heating device including, but not limited to, a lamp module, an LED lamp module, a resistive heating element, or any other radiant heater. While a wafer is positioned under the heating module 1130, the heating module 1130 is enabled and heats the wafer for a predetermined period of time to a predetermined temperature. In some embodiments, the heating module 1130 is located to the side of the carousel to heat at least one wafer support position 1111. In one or more embodiments, the heating module 1130 is located beneath at least some of the wafer support positions 1111 corresponding to a carousel index position.

In some embodiments, the heating module 1130 is positioned adjacent each of the processing chamber slit valves 1181 so that when the carousel 1110 is in an index position with a wafer adjacent the slit valve 1181, there is a support position 1111 located beneath each heating module 1130 adjacent the processing chamber slit valves 1181. For example, if there are two processing chambers 1180 positioned adjacent the buffer chamber 1100, a heating module 1130 is positioned at each of the index positions adjacent the slit valves 1181 associated with the processing chambers 1180. In some embodiments, there are more heating modules 1130 than processing chamber slit valves 1181. In some embodiments, there is at least one processing chamber slit valves 1181 that does not have a heating module 1130 adjacent thereto.

The distance between the heating module 1130 and the substrate surface can vary depending on, for example, the type of heater. In some embodiments, each of the at least one heating modules 1130 is located a distance from the carousel 1110 so that when a wafer 1116 is present, the distance D is in the range of about 0.0005 inches (0.01 mm) to about 3 inches (76 mm). In one or more embodiments, the distance D is in the range of about 0.02 mm to about 50 mm, or in the range of about 0.05 mm to about 40 mm, or in the range of about 0.1 mm to about 35 mm, or in the range of about 10 mm to about 45 mm, or in the range of about 20 mm to about 40 mm. In some embodiments, at least one heating module 1130 comprises a lamp and the distance D is in the range of about 20 mm and about 40 mm. A lamp used in this context is any radiant light source other than an LED which irradiates 1131 the substrate surface. In one or more embodiments, at least one heating module 1130 comprises LEDs and the distance D is in the range of about 5 mm to about 10 mm. In some embodiments, at least one heating module 1130 comprises a resistive heater and the distance D is less than or equal to about 1 mm. Some embodiments include collimating optics (not shown) which can be used to project light to greater distances with better efficiency than rapid thermal processing (RTP) lamps. In one or more embodiments, the heating module 1130 comprises a radiant light source, and collimating optics are positioned between the heating module 1130 and the carousel 1110. In one or more embodiments, the heating module 1130 is positioned a distance D up to about 25 inches (~65 mm) from the substrate surface. In some embodiments, the heating module 1130 is positioned to the side of the substrate and collimating optics are configured to project light onto the substrate.

The distance D between the heating module 1130 and the wafer surface is not static. Rather, the wafer may be moved closed to or further from the heating module 1130 during the pre-heating process. For example, during loading and unloading of a wafer onto the carousel 1110, the distance D is variable. While during heating, the distance D is typically maintained relatively consistent.

A motor 1118 is connected to the carousel 1110 to index the carousel 1110 so that at least one support position 1111 is aligned with a slit valve 1106 in one of the facets 1105. The motor 1118 can be any suitable type of motor that can rotate and/or lift the carousel 1110. The motor 1118 of some embodiments can rotate the carousel, or index the carousel, in discrete steps or continuously.

A wafer transfer robot 1140 is positioned below the carousel 1110 to move a wafer the wafer support position 1111 and another area. Other areas include, but are not limited to, a susceptor in a batch processing chamber and a loadlock chamber. The wafer transfer robot 1140 of some embodiments can use z-axis movement to lift wafers on/off the carousel 1110 and place the wafers to a facet position. In some embodiments, there are clearances or cutouts in the carousel 1110 for the robot blade 1230 to pass through the mechanism. When the transfer is complete the robot 1140 drops below the mechanism and the carousel 1110 can freely rotate to the next position. In some embodiments, after pre-heating or heating a wafer, the transfer robot 1140 can move and position the wafer 1116 in a processing chamber 1180 aligned with a slit valve 1181 in a time less than about 3 seconds.

In some embodiments, wafer preheating occurs in one or more (n) carousel positions preceding the exchange to the process chamber 1180 and loadlock. In one or more embodiments, the wafer spends 1+n complete exchange cycles (e.g., 15 sec×n) in preheat positions in parallel with the wafer transfer sequence. The preheating can happen in parallel with other transfers and may have a limited effect on the system throughput.

In a traditional system, the wafer can take up to 10 seconds to be transferred from a preheat chamber to the process chamber. During this 10 seconds the wafer loses a significant portion of the heat gained in the preheat chamber. Thus, it is common to heat the wafer much higher temperatures to compensate for the heat loss. The carousel system of one or more embodiments reduces this non-heating time significantly. A wafer heating module exists in the buffer chamber directly in front of the process chamber. The wafer can be pre-heated until the moment before the wafer is put in the process chamber. In some embodiments, one robot extension with a wafer takes about 2 seconds, compared to a full transfer from another chamber taking about 10 seconds. The heat loss in the carousel design is 80% less overall.

An exchange sequence in accordance with one or more embodiments of the disclosure. In the embodiment described, a six wafer loadlock is full with six unprocessed wafers. The vacuum robot begins by queuing two wafers into the carousel of the buffer chamber 1100 before the process chamber has completed the process. The wafers in the buffer chamber are preheated in the carousel. When the process chamber is complete, a processed wafer is transferred to an empty position on the carousel of the buffer chamber and an unprocessed wafer is transferred to another empty position on the carousel of the buffer chamber. The carousel indexes one slot. The unprocessed wafer begins heating and the heated wafer is transferred into the process chamber. The process chamber indexes and the cycle continue until all the processed wafers are replaced with unprocessed wafers.

In some embodiments, improving the speed and efficiency of the carousel mechanism is assisted by novel robot linkage designs to provide simultaneous exchanges with the process chamber and loadlock. The linkage layouts of various embodiments have 90 orientations and 180 degree orientation of each blade for handing the wafer. In some embodiments, the carousel system has no robot linkage components exist above the wafer or it would interfere with the carousel mechanism. Additionally most of the linkages are in the same plane making the robots relatively short in comparison to other designs. The robot geometries of some embodiments align both wafers on substantially the same plane and at the highest position in the robot base, arm, linkage stack. As used in this specification and the appended claims, the term "substantially the same plane" and the like means that the elements are coplanar within about 10 mm, 5 mm, 4 mm, 3 mm, 2 mm or 1 mm. In addition to allowing the use of the carousel, positioning the robot mechanism below the wafers is considered ideal for particle performance. Some embodiments of alternate linkage designs have applications beyond the carousel architecture. If the platform throughput is low enough, the carousel would work well with many traditional single arm robots widely available today.

Figure 6B:
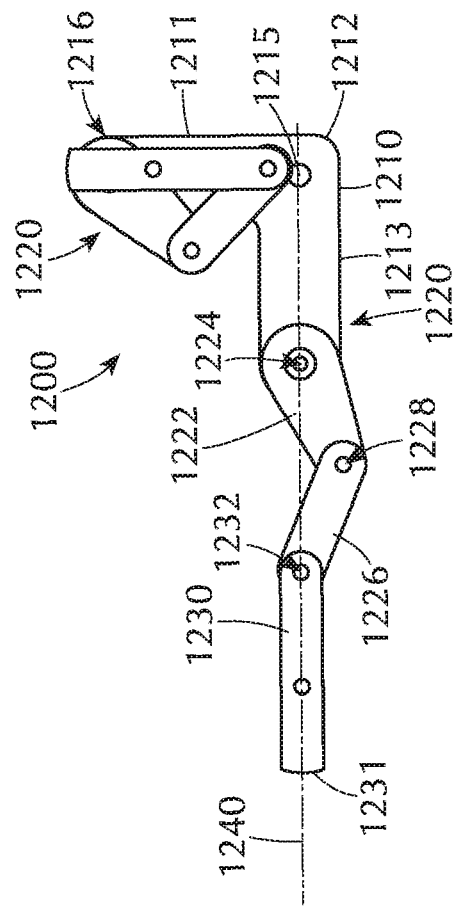
FIGS. 6A and 6B show transfer robots in accordance with one or more embodiment of the disclosure.
Figure 6A:
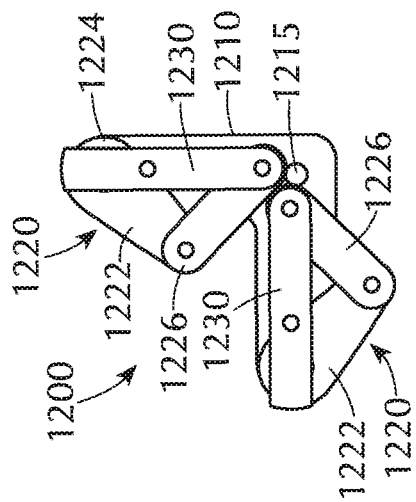

Embodiments of the transfer robots can be separated into two broad groups: a short armset robot on a long boom; and a long armset robot on a short boom. Referring to FIGS. 6A and 6B, one or more embodiments of a short armset robot on a long boom are described. A wafer transfer robot 1200 includes a boom 1210 that supports at least one armset 1220. The boom 1210 shown is L-shaped, or a 90° boom. The boom 1210 has a first leg 1211 and a second leg 1213 attached at a corner of central portion 1212. Even though the boom 1210 is an integral component and the legs 1211, 1213 are not separate pieces, the term "attached", "connected", and the like, used in this regard, refer to the intersection of different legs and does not mean that there are separate components. The embodiment shown in FIGS. 6A and 6B include two armsets 1220. Each of the armsets 1220 have a lower arm 1222 attached to the boom 1210 at a shoulder 1224. An upper arm 1226 is attached to the lower arm 1222 at an elbow 1228. A blade 1230 is attached to the upper arm 1226 at a wrist 1232. The blade 1230 is on top of the upper arm 1226, the upper arm 1226 is on top of the lower arm 1222, and the lower arm 1222 is on top of the boom 1210 and no part of the transfer robot 1200 extends above the blade 1230 that can interfere with the carousel.

A short armset robot on a long boom is defined so that the combined length of the armset from shoulder to an end of the blade has a length that is up to about 2 times the length from a pivot point 1215 of the boom 1210 to the shoulder 1224. In some embodiments, a short armset robot on a long boom has a shoulder 1224 to end 1231 of blade 1230 length that is up to about 2.25, 2.5, 2.75 or 3 times the length from the pivot point 1215 of the boom 1210 to the shoulder 1224.

A long armset robot on a short boom is defined so that the combined length of the armset 1220 from shoulder 1224 to an end 1231 of the blade 1230 has a length that is greater than about 2.5 times a length from a pivot point 1215 of the boom 1210 to the shoulder 1224. In some embodiments, the long armset robot on a short boom has an armset length greater than about 2.75, 3, 3.25 or 3.5 times the length from the pivot point 1215 of the boom 1210 to the shoulder 1224.

In a short armset on long boom type configuration, a base or boom extends a shorter linkage arm set close to the process chamber opening. The shorter linkage design allows for a light weight and thin linkage design optimal for extension into a process chamber. The longer boom can be made thick and stiff. The effect is a very stable and fast robot design for wafer transfer. The wafers are on the same transfer plane and at a 90 degree orientation.

Referring again to FIGS. 6A and 6B, the boom 1210 is L-shaped and has an armset 1220 at an end 1216 of each leg 1211, 1213 of the boom 1210. Each armset 1220 extends along an axis 1240 of the leg 1213 of the boom 1210 so that in a retracted position (FIG. 6A) the blade 1230 is parallel to and positioned over the leg 1211 of the boom 1210 with the wrist 1232 adjacent an angled portion of the L-shaped boom 1210. The angled portion of the boom 1210 is the same region as the connection of the legs 1211, 1213.

The transfer robot 1200 of some embodiments includes a pulley which causes the shoulder 1224, elbow 1228 and wrist 1323 to extend substantially simultaneously so that the blade 1230 remains parallel to the leg 1213 during extension. As used in this specification and the appended claims, the term "substantially simultaneously" means that the movement of the armset components occurs at the same time, and does not mean that the movement of the various components occurs at the same rate.

Figure 7:
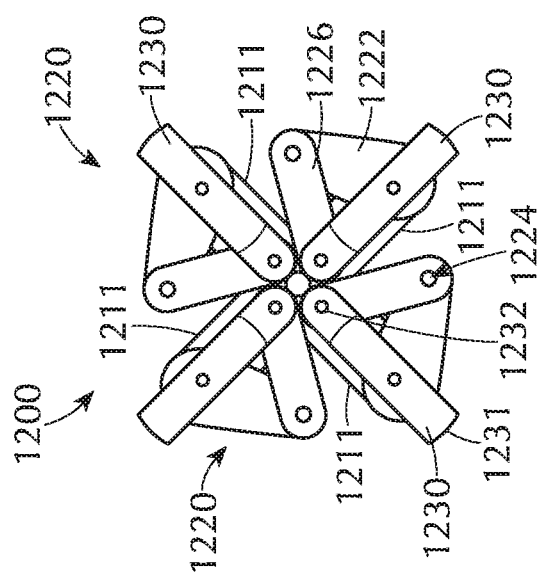
FIG. 7 shows a transfer robot in accordance with one or more embodiment of the disclosure.

FIG. 7 shows an embodiment of the transfer robot 1200 in which the boom 1210 is X-shaped. The robot 1200 has an armset 1220 at an end 1216 of each leg 1211 of the boom 1210. Each armset 1220 extends along an axis of the leg 1211 of the boom 1210 so that in a retracted position (shown in FIG. 7) the blade 1230 is parallel to and positioned over the leg 1211 of the boom 1210 with the wrist 1232 adjacent a central portion 1212 of the X-shaped boom 1210.

In this short armset on long boom variant, simultaneous exchange of four wafers can be accomplished. In some embodiments, this configuration can be used to replace rotating of the entire robot assembly; instead the robot's primary axis of rotation remains stationary. This might provide a significant throughput benefit in a multi-step sequence process by enabling four simultaneous exchanges.

Figure 8:
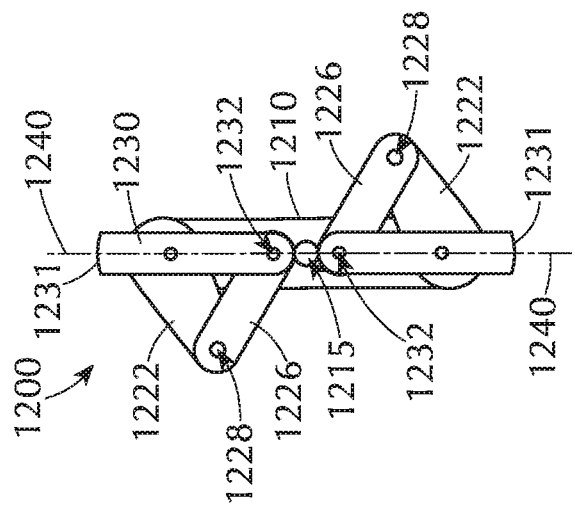
FIG. 8 shows a transfer robot in accordance with one or more embodiment of the disclosure.

FIG. 8 shows a transfer robot 1200 in which the boom 1210 is I-shaped or straight and has an armset 1220 at each end 1216 of the boom 1210. Each armset extends along an axis 1240 of the boom 1210 so that in a retracted position (shown) the blade 1230 is parallel to and positioned over the boom 1210 with the wrist 1232 adjacent a central portion 1212 of the I-shaped boom 1210.

This variant of the short armset with long boom design positions the robot extension arms at a 180 degree orientation. This type of short arm and long boom design might be able to achieve many 2× arm orientation configurations to provide quick sequential exchanges with process chambers in many cluster tools.

Figure 9B:
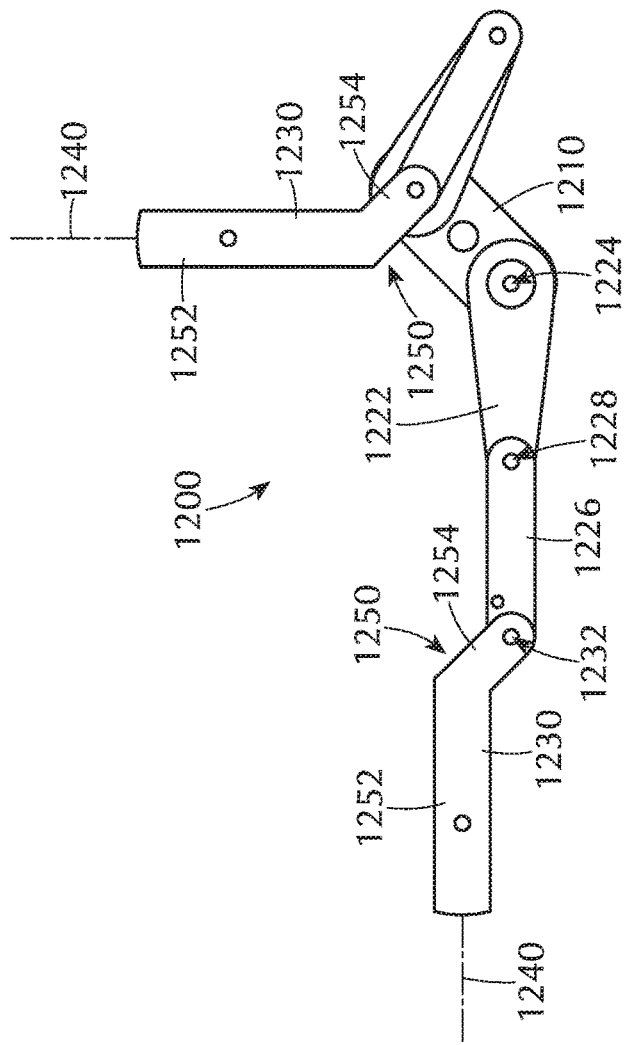
FIGS. 9A and 9B show a transfer robot in accordance with one or more embodiment of the disclosure.
Figure 9A:
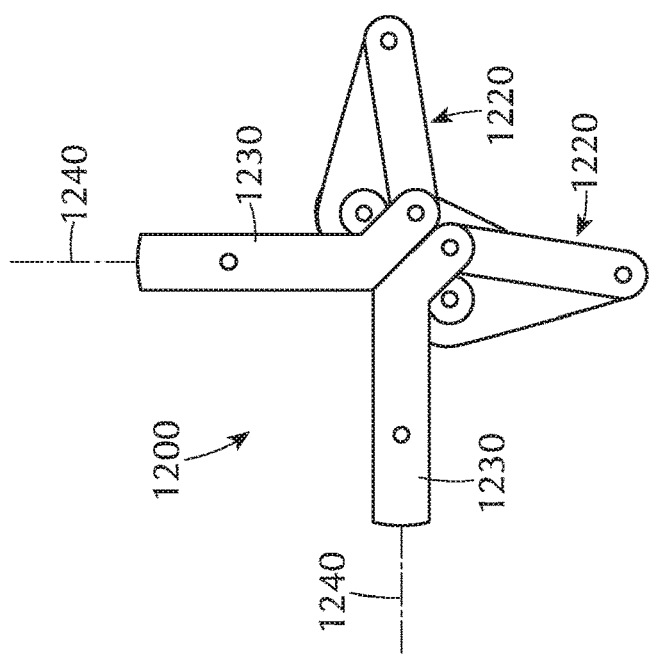

FIGS. 9A and 9B show a long armset short boom with 45 degree offset. In this configuration, the base or boom arm extends to attach the linkage armset at a 45 degree angle offset from the centerline and closer to the chamber. This enables a longer linkage arm design which extends the total reach of the robot. This also allows for longer blade lengths and less arm inside the process chamber. The boom 1210 is I-shaped and positioned at 45° to a major axis 1240 of the movement of the blades 1230. Here, the blade 1230 is offset 1250 so that a majority portion 1252 of the blade 1230 lies along the major axis 1240 of the movement and a portion 1254 of the blade 1230 adjacent the wrist 1232 lies at 45° to the major axis 1240. Upon full extension of the armset 1220, the lower arm 1222, upper arm 1226, shoulder 1224, elbow 1228 and wrist 1232 are parallel to and offset from the major axis 1240.

Figure 10B:
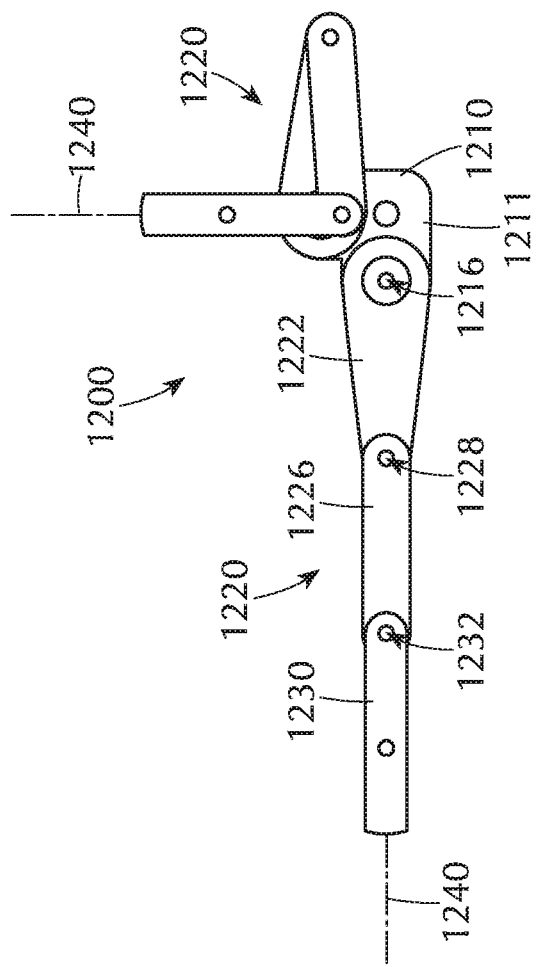
FIGS. 10A and 10B show a transfer robot in accordance with one or more embodiment of the disclosure.
Figure 10A:
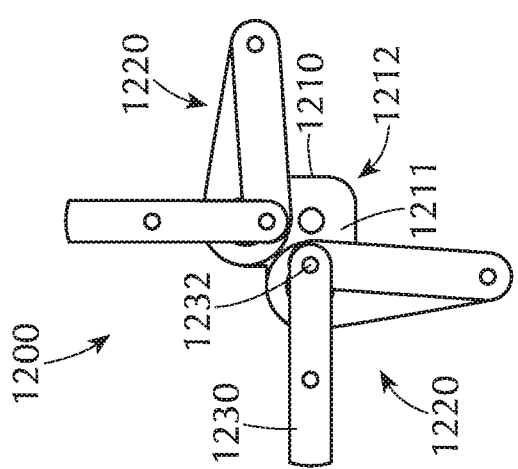

FIGS. 10A and 10B show another embodiment of the short boom design that positions the center other arm linkage in the center of the extension facet instead of offset. This shortens the arms and blades and allows for a relatively small sweep diameter. In this embodiment, the boom 1210 is L-shaped and has an armset 1220 at an end 1216 of each leg 1211 of the boom 1210. Each armset 1220 extends along an axis 1240 of the leg 1211 of the boom 1210 so that in a retracted position (FIG. 10A) the blade 1230 is parallel to and positioned over the leg 1211 of the boom 1210 with the wrist 1232 adjacent an angled central portion 1212 portion of the L-shaped boom 1210. When the armset 1220 is extended (as shown in FIG. 10B) the lower arm 1222, upper arm 1226 and blade 1230 lie substantially along axis 1240.

Figure 11A:
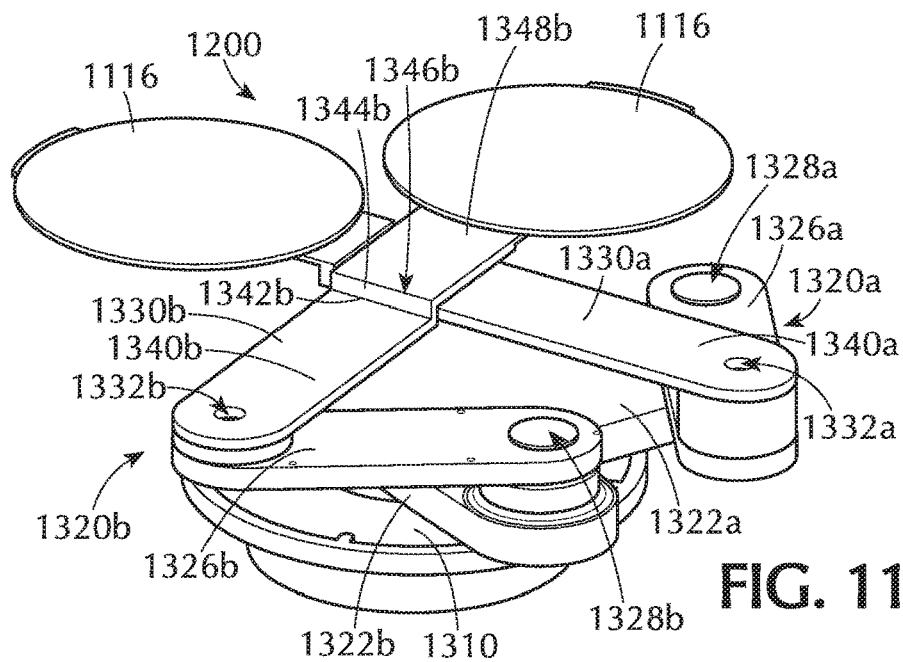
FIGS. 11A-11C show a transfer robot in accordance with one or more embodiment of the disclosure.
Figure 11B:
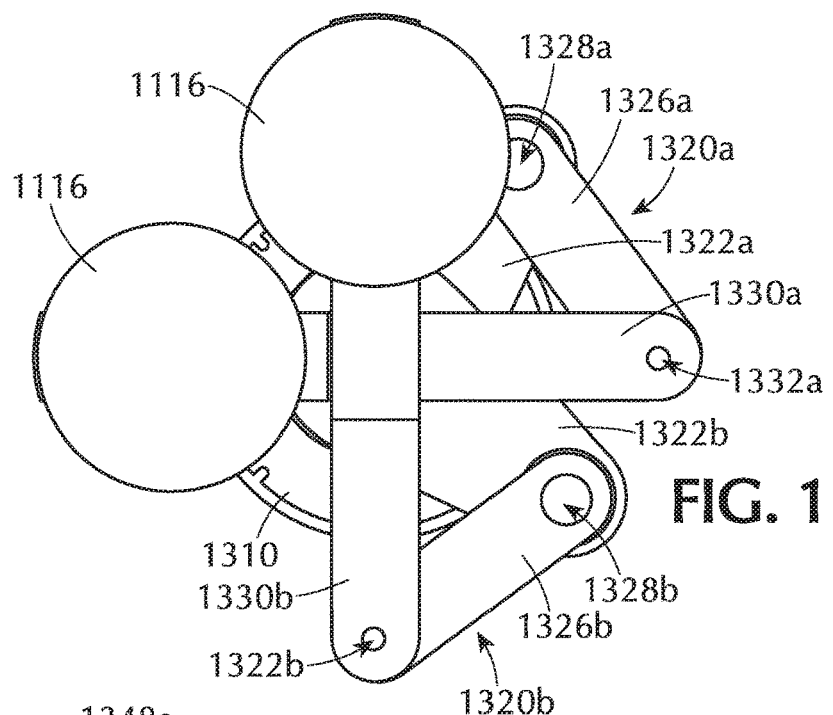
Figure 11C:
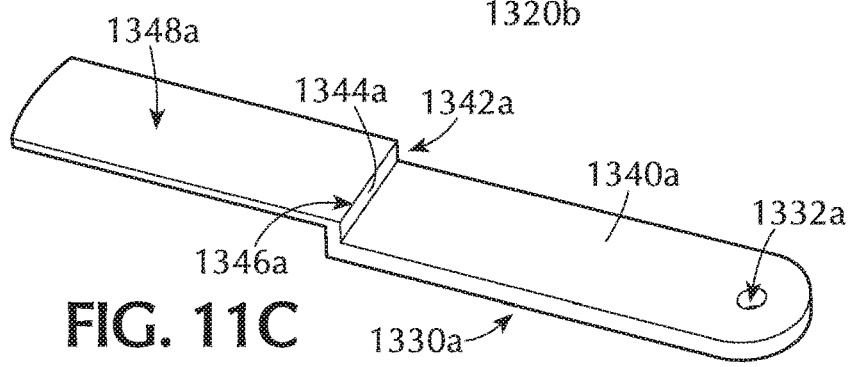

FIGS. 11A to 11C show another embodiment of a robot 1200 using stacked Scara linkages with 90 degree Planar Blades. The configuration is a variant of the standard stacked linkage design with two arms. The linkages are positioned so that the blades 1230 with wafers 1116 can extend to two facets at 90 degrees. In conjunction with a carousel design the extension of one blade 1230 is dependent on the extension of the other blade 1230. An advantage of this configuration is that very long blades and/or blade adaptors can be used so that the robot works in a standard slit opening and bearings in the wrist 1232 are kept very far away from heated process chamber components. The wafer transfer robot 1200 shown includes a base 1310 which can be a boom 1210 or other stationary or rotatable component. A first armset 1320a comprises a first lower arm 1322a connected to the base 1310 at a first shoulder 1324a. A first upper arm 1326a is connected to the first lower arm 1322a at a first elbow 1328a. A first blade 1330a is connected to the first upper arm 1326a at a first wrist 1332a. As shown in FIG. 11C, the first blade 1330a has a first inner blade portion 1340a extending a first length from the first wrist 1332a to a first lower corner 1342a. A first intermediate blade portion 1344a extends perpendicularly from the first inner blade portion 1340a to a first upper corner 1346a. A first outer blade portion 1348a extends perpendicularly to the first intermediate blade portion 1344a in a direction away from and parallel to the first inner blade portion 1340a. A second armset 1320b comprises a second lower arm 1322b connected to the base 1310 at a second shoulder 1324*b*. A second upper arm 1326*b* is connected to the second lower arm 1322*b* at a second elbow 1328*b*. A second blade 1330*b* is connected to the second upper arm 1326*b* at a second wrist 1332*b*. The second blade 1330*b* has a similar construction as that of the first blade 1330*a* shown in FIG. 11C. The second blade has a second inner blade portion 1340*b* extends a second length from the second wrist 1332*b* to a second lower corner 1342*b*. A second intermediate blade portion 1344*b* extends perpendicularly from the second inner blade portion 1340*b* to a second upper corner 1346*b* and a second outer blade portion 1348*b* extends perpendicularly to the second intermediate blade portion 1344*b* in a direction away from and parallel to the second inner blade portion 1340*b*. The first length is greater than the second length and the first outer blade portion 1348*a* and the second outer blade portion 1348*b* support wafers substantially coplanarly. In some embodiments, the second armset 1320*b* cannot extend until the first armset 1320*a* has extended, and the first armset 1320*a* cannot retract until the second armset 1320*b* has retracted.

Figure 12A:
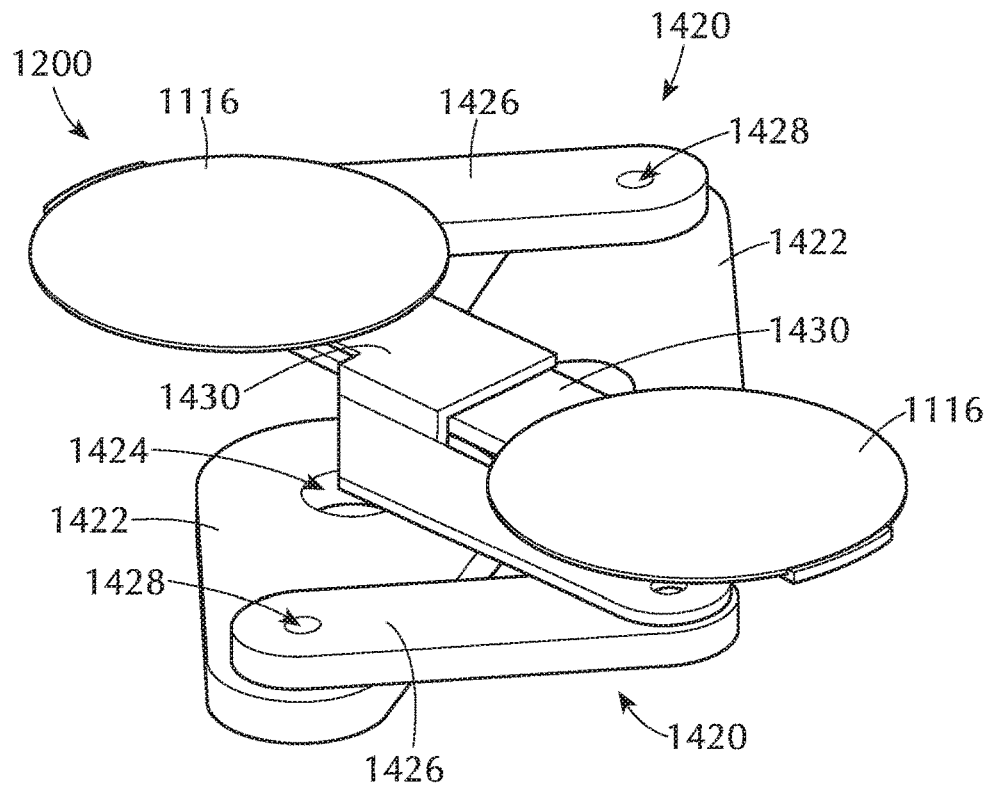
FIGS. 12A and 12B show a transfer robot in accordance with one or more embodiment of the disclosure.
Figure 12B:
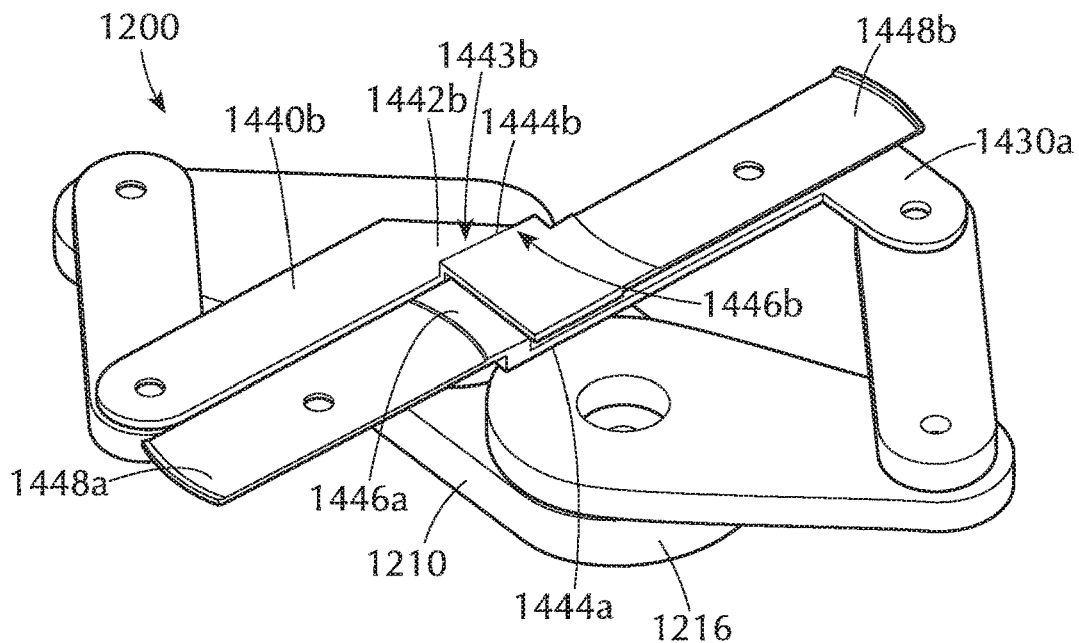

FIGS. 12A and 12B show another embodiment of a long armset on short boom. In this configuration, the boom 1210 is offset from the centerline of the facet. A traditional scara linkage design is positioned side-by-side with an offset blade/blade adaptor. The two blades 1230 that hold the wafers are stacked and positioned at 180 degrees from each other with the wafers on the same plane for carousel operation. One advantage of this configuration is the robot arms, bearings, wrist, etc. are all below the wafer transfer plane so they do not interfere with the carousel mechanism. The robot 1200 comprises a boom 1210 with an I-shape having a first end 1216 and a second end 1216. The first armset 1420*a* comprising a first lower arm 1422*a* connected to the boom 1210 at a first shoulder 1424*a* at the end of the boom. A first upper arm 1426*a* is connected to the first lower arm 1422*a* at a first elbow 1428*a*. A first blade portion 1430*a* is connected to the first upper arm 1426*a* at a first wrist 1432*a*. The first blade 1430*a* has a first inner blade portion 1440*a* extending a first length from the first wrist 1432*a* to a first lower corner 1442*a*, a first intermediate blade portion 1444*a* extends perpendicularly from the first inner blade portion 1440*a* to a first upper corner 1446*a* and a first outer blade portion 1448*a* extends perpendicular to the first intermediate blade portion 1444*a* in a direction away from and parallel to the first inner blade portion 1430*a*. The second armset 1420*b* comprises a second lower arm 1422*b* connected to the boom 1210 at a second shoulder 1424*b* at the second end of the boom 1210. A second upper arm 1426*b* is connected to the second lower arm 1422*b* at a second elbow 1428*b*. A second blade 1430*b* is connected to the second upper arm 1426*b* at a second wrist 1432*b*. The second blade 1430*b* has a second inner blade portion 1440*b* extending a second length from the second wrist 1432*b* to a second lower corner 1442*b*. A second angled blade portion 1443*b* extends at an angle to and along the plane of the second inner blade portion 1440*b*. A second intermediate blade portion 1444*b* extends perpendicularly from the second angled blade portion 1443*b* to a second upper corner 1446*b* and a second outer blade portion 1448*b* extends in a plane perpendicular to the second intermediate blade portion 1444*b* in a direction away from, parallel to and offset from the second inner blade portion 1440*b*. When in the retracted position, the second outer blade portion 1448*b* is above the first inner blade portion 1440*a* and the first outer blade portion 1448*a* is above and offset from the second inner blade portion 1440*b*. The first outer blade portion 1448*a* and the second outer blade portions 1448*b* are substantially coplanar.

Figure 13B:
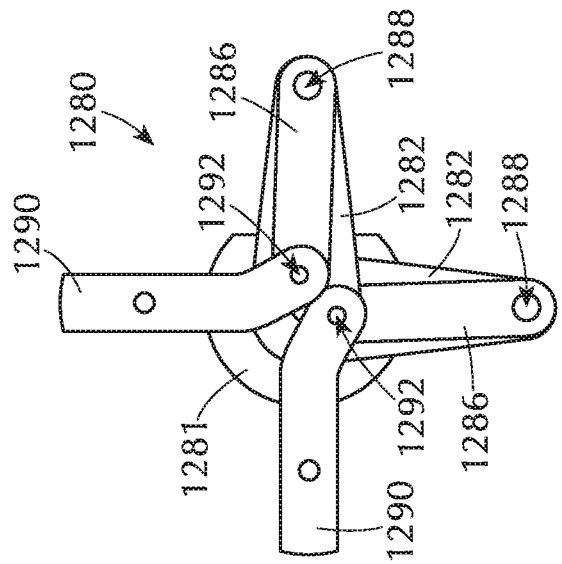
FIGS. 13A and 13B show a transfer robot in accordance with one or more embodiment of the disclosure.
Figure 13A:
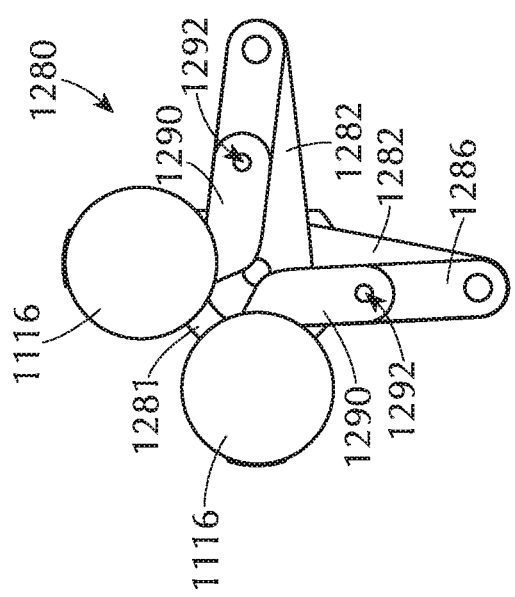

FIGS. 13A and 13B show a stacked long armset robot 1280 in accordance with another embodiment of the disclosure. In this robot configuration, the lower arms 1282 are stacked for a simple coaxial drive mechanism but the upper arms 1286 are coplanar. This allows for a simpler drive mechanism without the need for the "boom" but keeps all the mechanicals below the wafer transfer plane. This configuration also keeps the wafers in the same wafer transfer plan.

Figure 14:
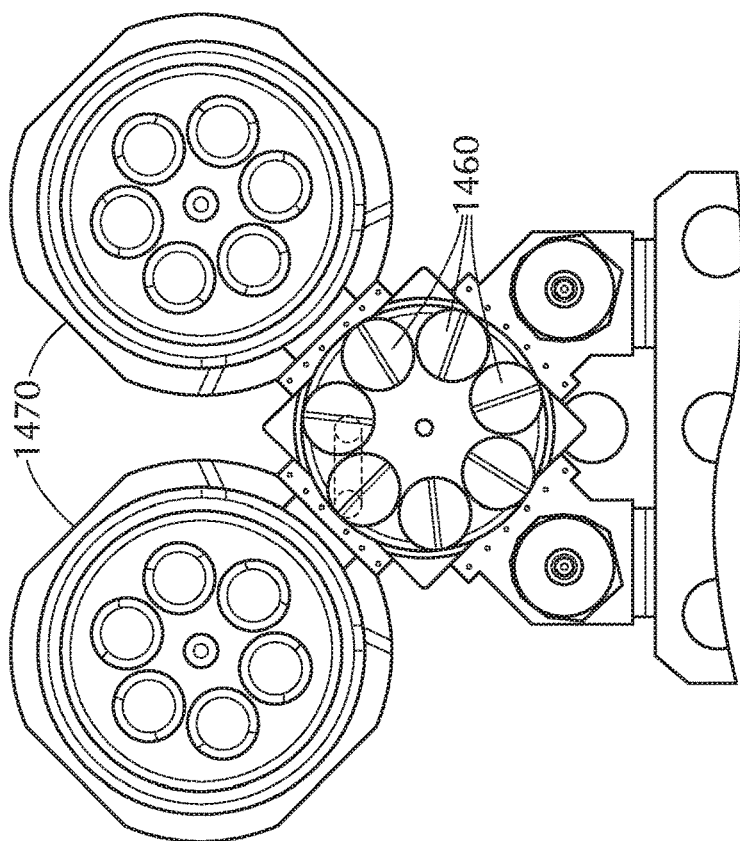
FIG. 14 shows a cluster tool in accordance with one or more embodiment of the disclosure.

The specific number of wafers in the carousel can impact throughput. In one embodiment, as shown in FIG. 14, seven carousel positions 1460 are available to support the six wafer batch processing chambers 1470. This approach decouples the loadlock cycle from the process chamber cycle and allows the cycles to work in parallel improving throughput of the system. An advantage of an n+1 wafer carousel design is that it enables the use of simpler single arm robot with the throughput cost of all the additional rotations. In addition the preheat time available is significantly higher in the n+1 carousel configuration.

Each additional carousel position generally provides another exchange cycle (~15 s) of wafer heating time. Not all positions of the carousel might have lamp modules, or not all lamp modules are used. Only enough modules are used to achieve the predetermined temperature, making the carousel configurable for the application.

Figure 15:
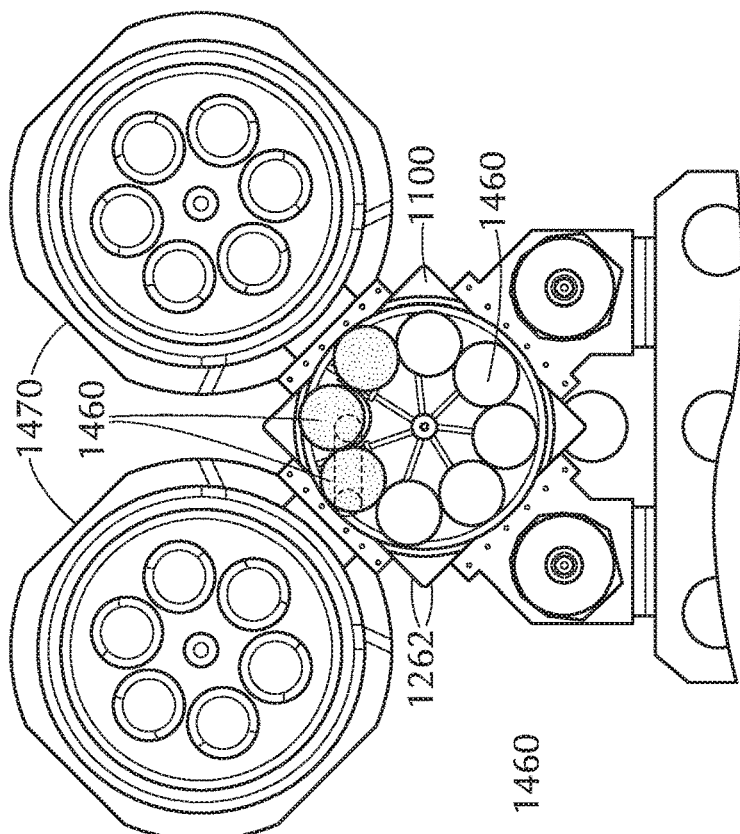
FIG. 15 shows a cluster tool in accordance with one or more embodiment of the disclosure.

In another embodiment with a six wafer batch processing chamber 1470, as shown in FIG. 15, each facet 1462 of the chamber 1100 is at 90 degrees. Eight wafer carousel positions 1460 are shown. Here, a wafer will always be aligned with one of the process chamber facets enabling the dual simultaneous exchanges between chambers and loadlocks. This with further improve the throughput of the system.

Numerous heating devices can be configured to the carousel system. Standard lamp modules that radiate heat from 3000 K lamps may be used, especially when heating wafers over 300° C. in a short period of time. Lamp modules are fairly large and might pose some integration risk in the carousel configuration since they would typically operate on a line-of-sight through the transfer chamber lid. Alternately, LED Lamp modules might be configured below the lip of transfer chamber lid allowing for more integration space and/or more carousel positions. Thin resistive type heaters could also be used in the same application. The heaters could either rotate with the carousel or be stationary in the buffer chamber.

Figure 16:
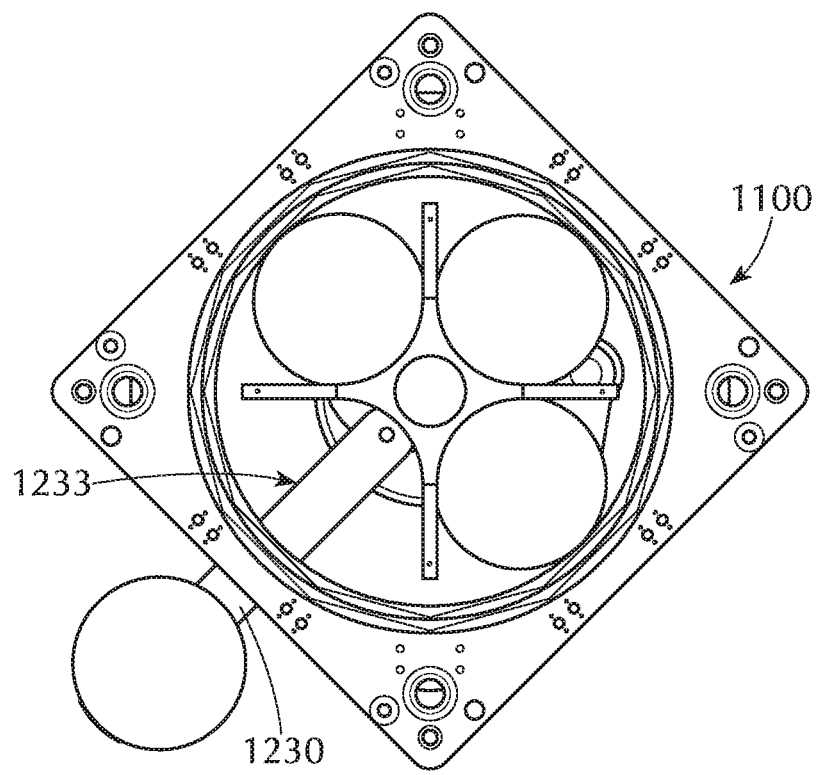
FIG. 16 shows a buffer chamber in accordance with one or more embodiment of the disclosure.

When the robot is positioned below these high temperature heating elements it might be beneficial to shield the robot from exposure to heat. The carousel wafer heating concept utilizes at least one lamp or LED type heaters positioned on the top of the buffer chamber. These lamps or heaters are used to heat the wafers positioned on the carousel below the lamps and above the transfer robot. When the lamps are turned on the radiant energy from the lamps heats everything below the lamp module including the robot. The lamps emit a significant amount of infrared light energy that passes thru the silicon wafers and is absorbed by the robot without adequate shielding. The energy absorbed by the robot affects the reliability and life of the robot components. FIG. 16 shows the robot's exposure to radiant heat, especially when the robot blade 1230 is extended. The portion 1233 of the extended robot blade 1230 within the chamber 1100 is subjected to radiant heating when the robot blade 1230 is extended because there is no physical barrier between the radiant heat source and the portion 1233 of the robot blade 1230. The radiant heat source is not shown in FIG. 16, but exists above the plane of the page as viewed.

Figure 17:
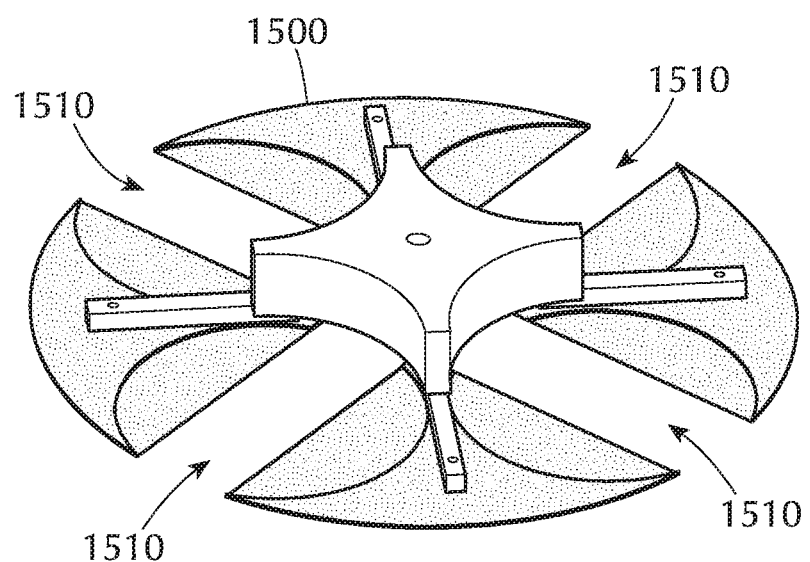
FIG. 17 shows a primary shield for a buffer chamber in accordance with one or more embodiment of the disclosure.
Figure 18:
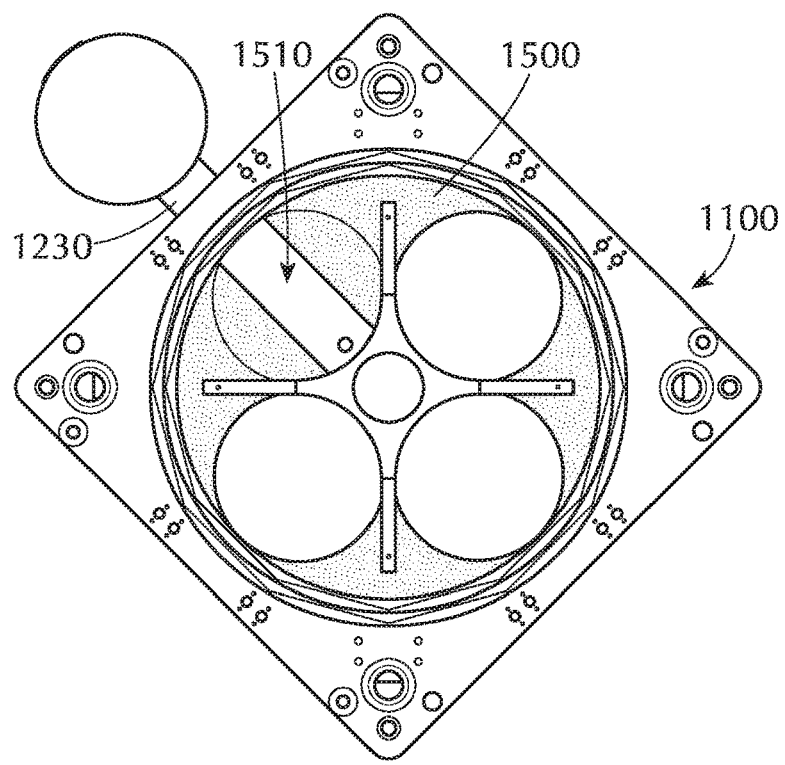
FIG. 18 shows a buffer chamber in accordance with one or more embodiment of the disclosure.
Figure 19:
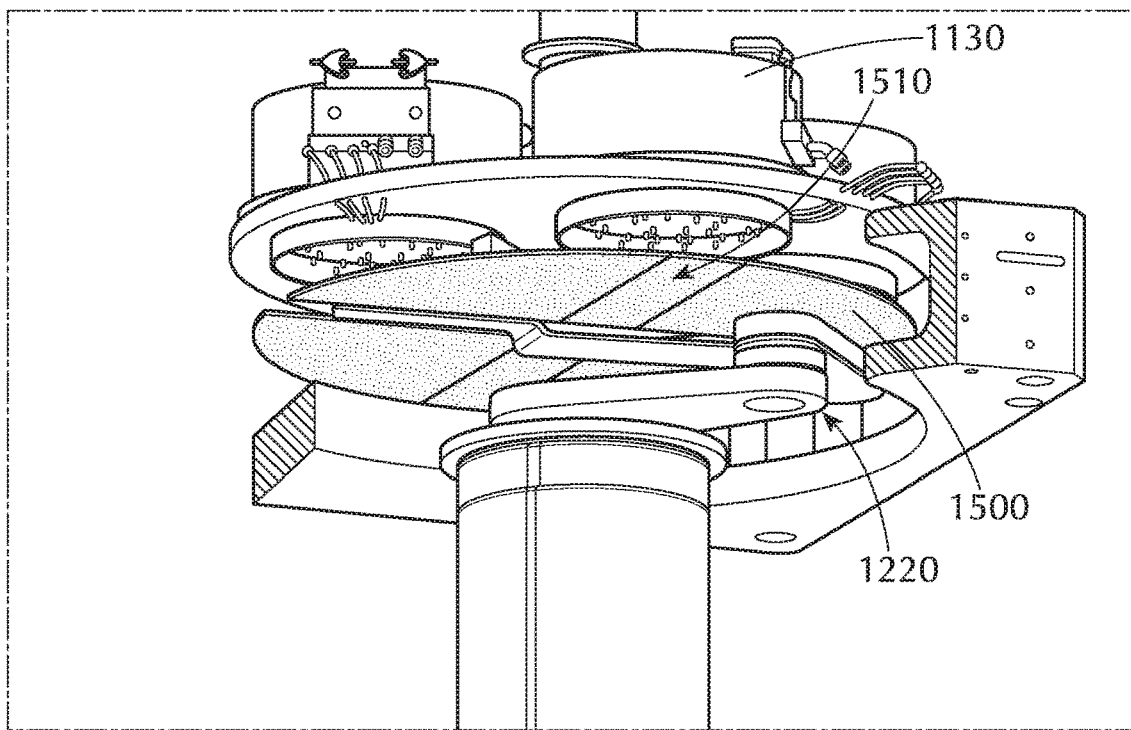
FIG. 19 shows a buffer chamber in accordance with one or more embodiment of the disclosure.

Referring to FIG. 17, in some embodiments, the bottom of the carousel has a large mirror finish shield 1500 capable of reflecting radiant energy from the lamps. Cutouts 1510 in the shield 1500 allow the robot to pick up and blade wafers on the wafer supports. The wafer supports can either be part of the primary shield 1500 or an additional supporting structure. The primary shield 1500 of some embodiments is located between the carousel and the transfer robot to shield the robot from at least one heating module. Shielding, as used herein, does not mean that the robot is completely protected from exposure to the heating module but merely means that the amount of radiant energy, for example, from the heating module is attenuated or partially blocked. FIGS. 18 and 19 show the robot's exposure to radiant heat using a primary shield 1500.

Figure 20:
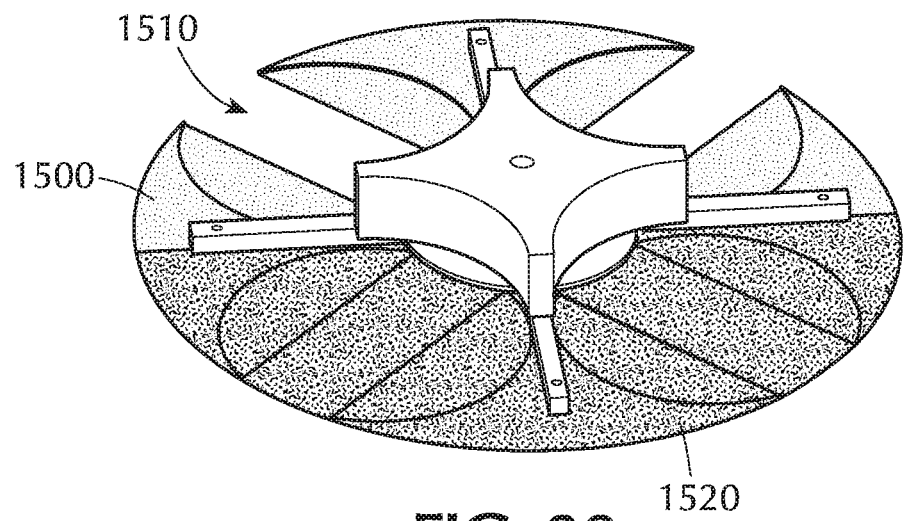
FIG. 20 shows a primary shield and a secondary shield for a buffer chamber in accordance with one or more embodiment of the disclosure.
Figure 21:
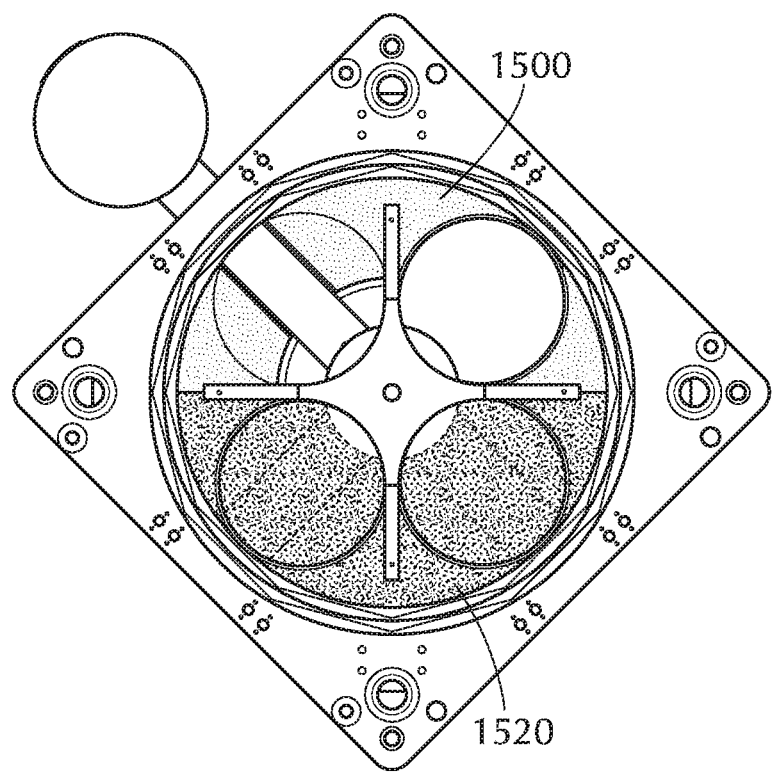
FIG. 21 shows a buffer chamber in accordance with one or more embodiment of the disclosure.

The primary shield 1500 of some embodiments protects most of the exposed areas of the robot. However, the large cutouts 1510 for the robot blade 1230 still expose the robot arms and linkages to the radiant lamp energy passing through and radiating from the wafer. In some embodiments, a second half circle shield, or secondary shield 1520 is positioned below the first shield or primary shield 1500. The secondary shield 1520 can be, for example, attached to an independent rotation access that allows rotating under the non-transfer heating positions to reflect lamp irradiation that passes through the cutouts in the primary shield 1500. FIGS. 20 and 21 show the combination of primary shield 1500 and secondary shield 1520 and the robot exposure using both shields. The combined effect of the thermal shielding prevents the robot from be exposed to direct radiation from the lamp modules during the wafer heating process. The shields could also be cooled to reduce the amount of radiation from them to the robot.

Figure 22:
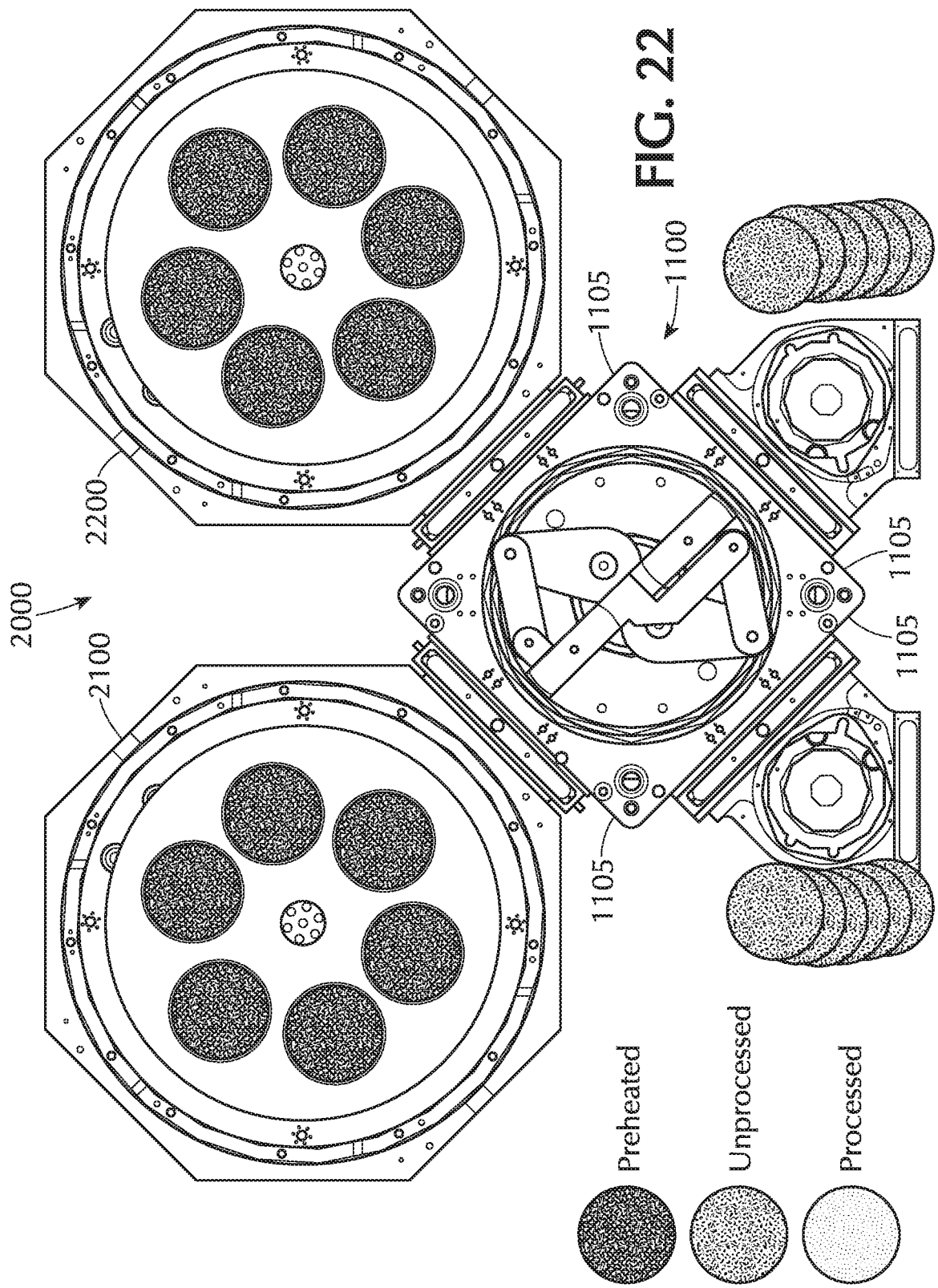
FIGS. 22 through 30 show a cluster tool in use with a buffer chamber in accordance with one or more embodiment of the disclosure.

Additional embodiments of the disclosure are directed to cluster tools. Referring to FIG. 22, a cluster tool 2000 comprises a buffer chamber 1100 according to any of the described embodiments. The buffer chamber 1100 shown has four facets 1105. A first batch processing chamber 2100 is connected to one of the four facets 1105 and a second processing chamber 2200 is connected to a second of the four facets 1105. In this embodiment, the first and second processing chambers are attached to facets that are adjacent to each other. In some embodiments, each of the first batch processing chamber 2100 and the second batch processing chamber 2200 can process n wafers at the same time and the buffer chamber 1100 has a carousel with n+1 or n+2 support positions. In the embodiment shown in FIGS. 22 through 30, the buffer chamber 1100 holds four wafers. This is merely for illustrative purposes and should not be taken as limiting the scope of the disclosure.

Figure 23:
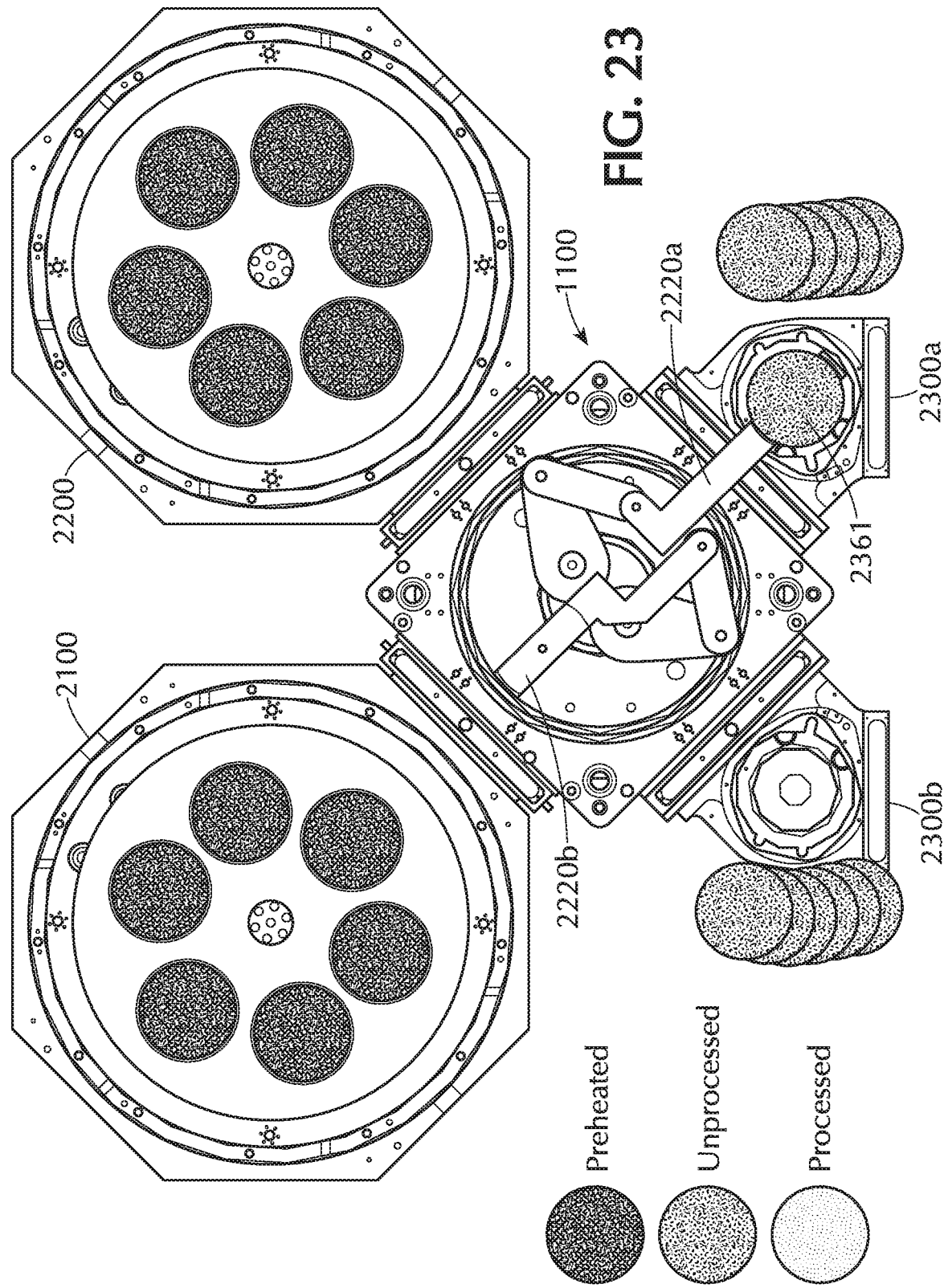
Figure 24:
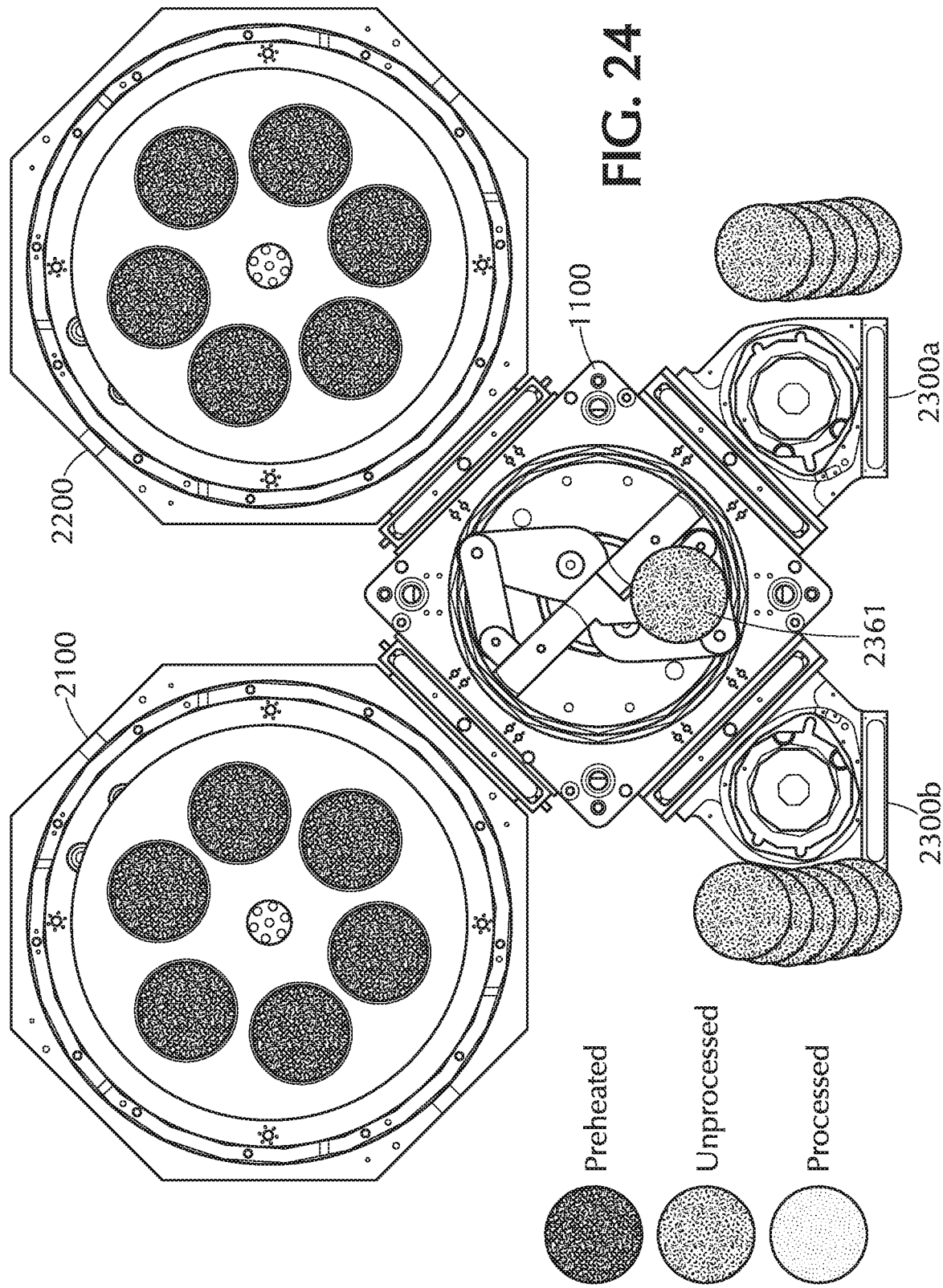
Figure 25:
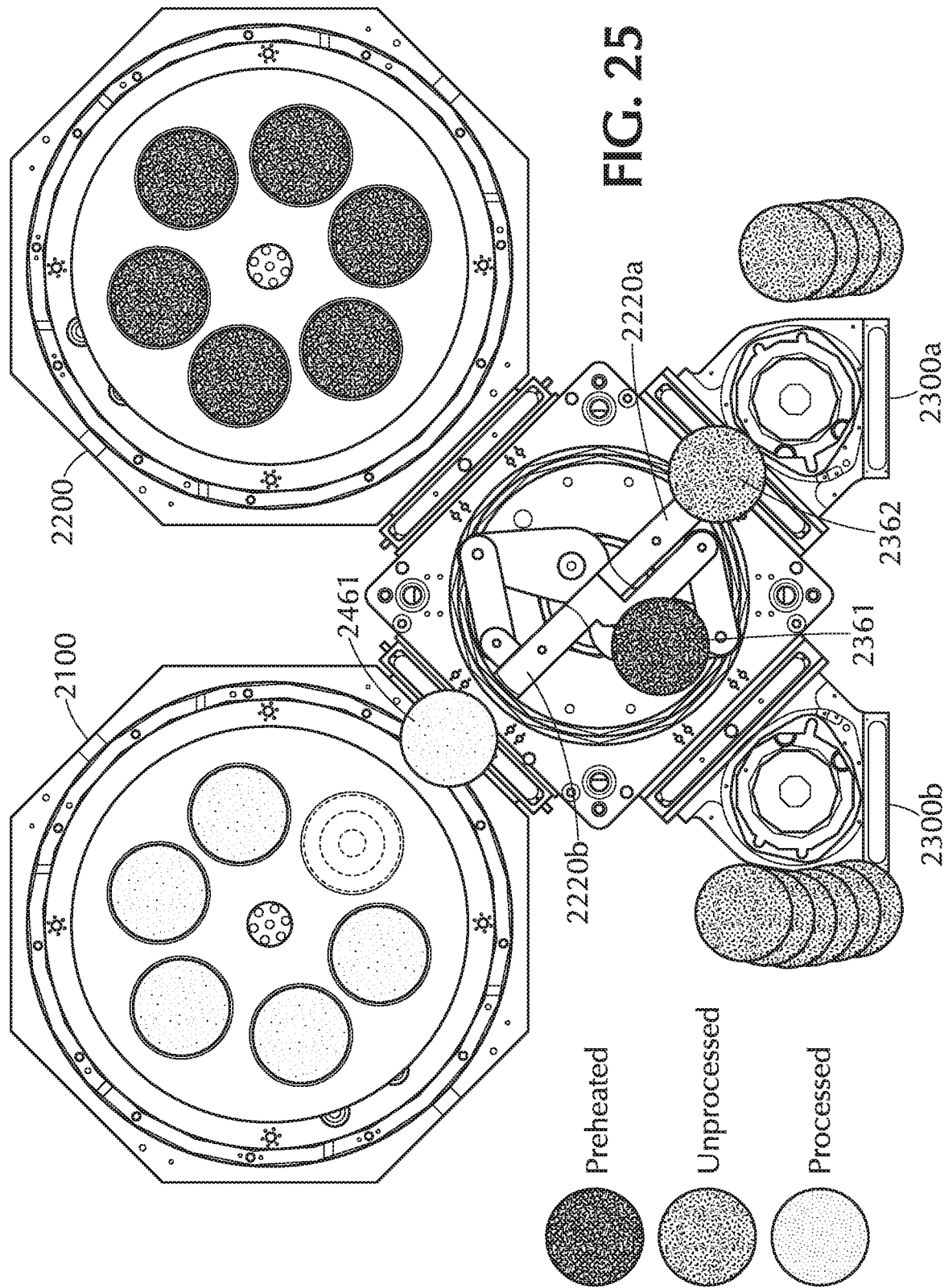
Figure 26:
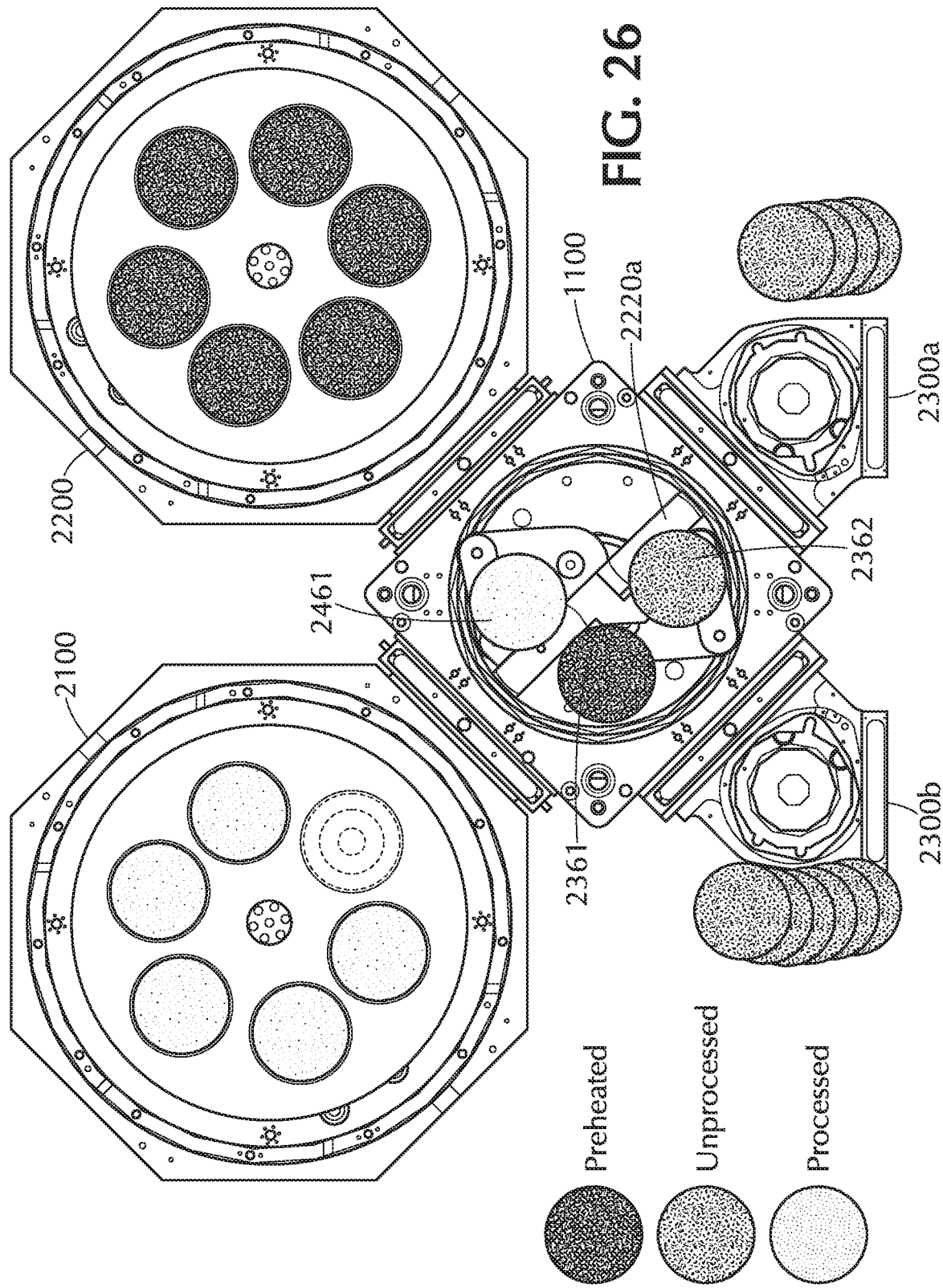
Figure 27:
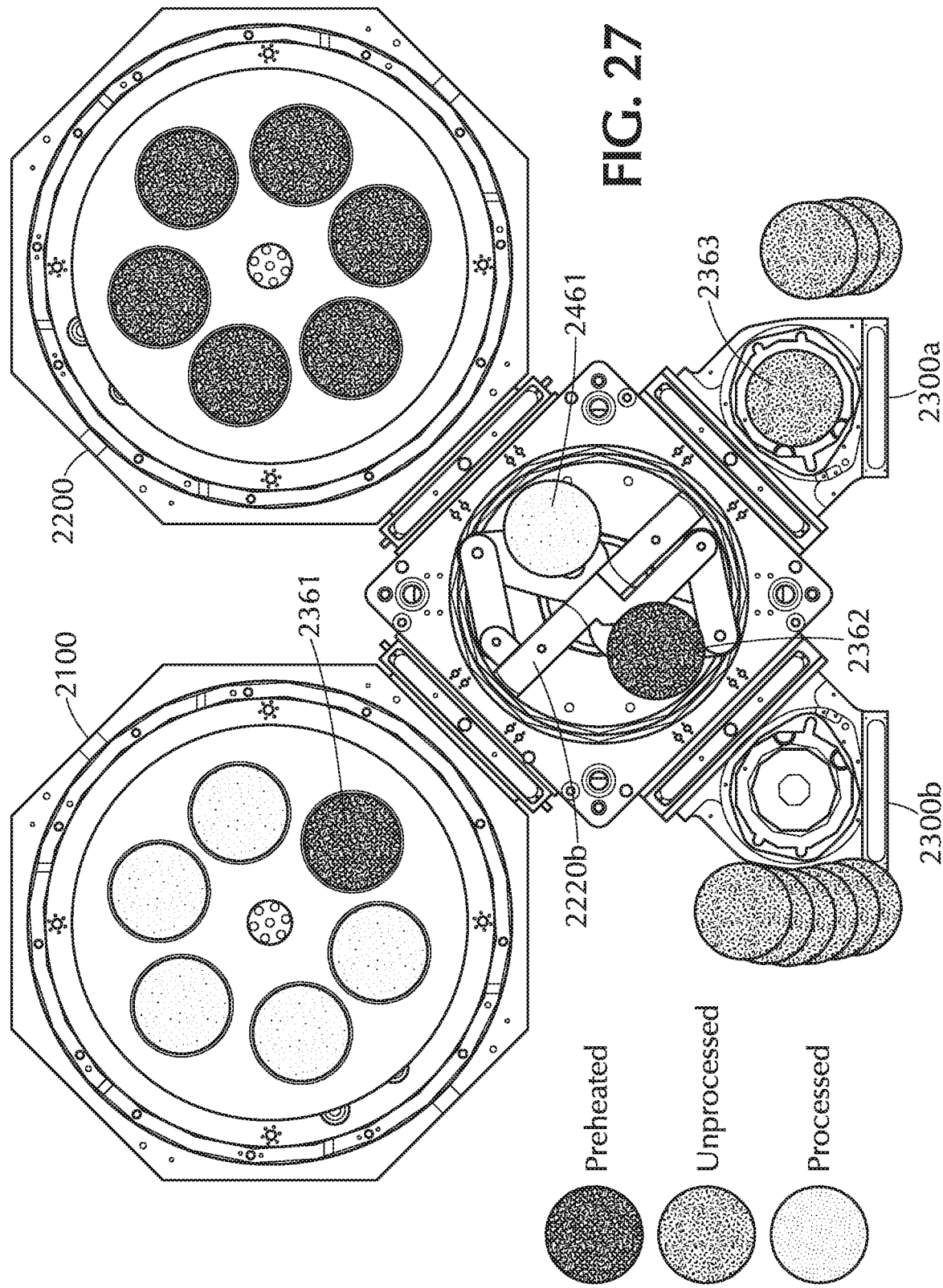
Figure 28:
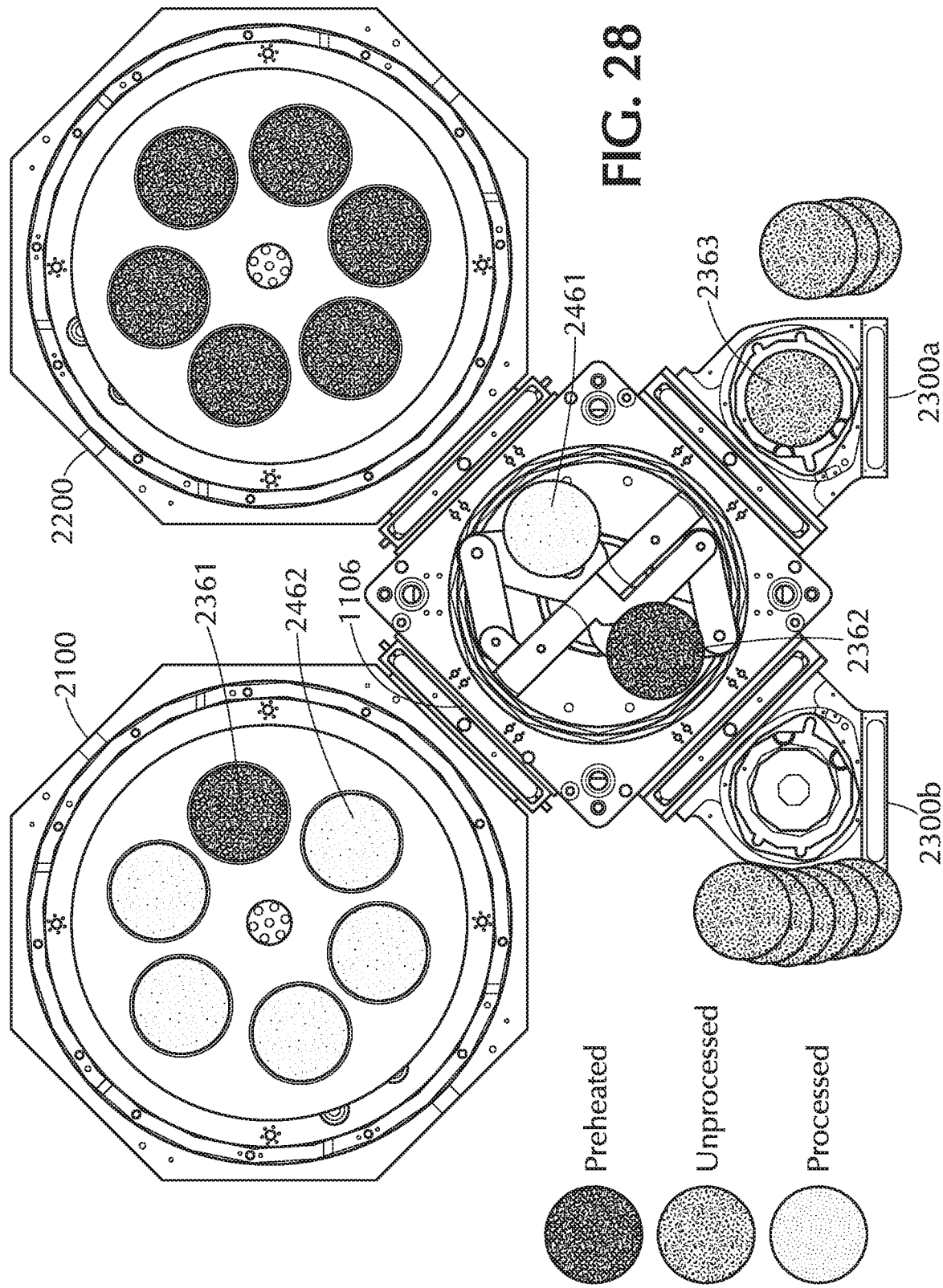
Figure 29:
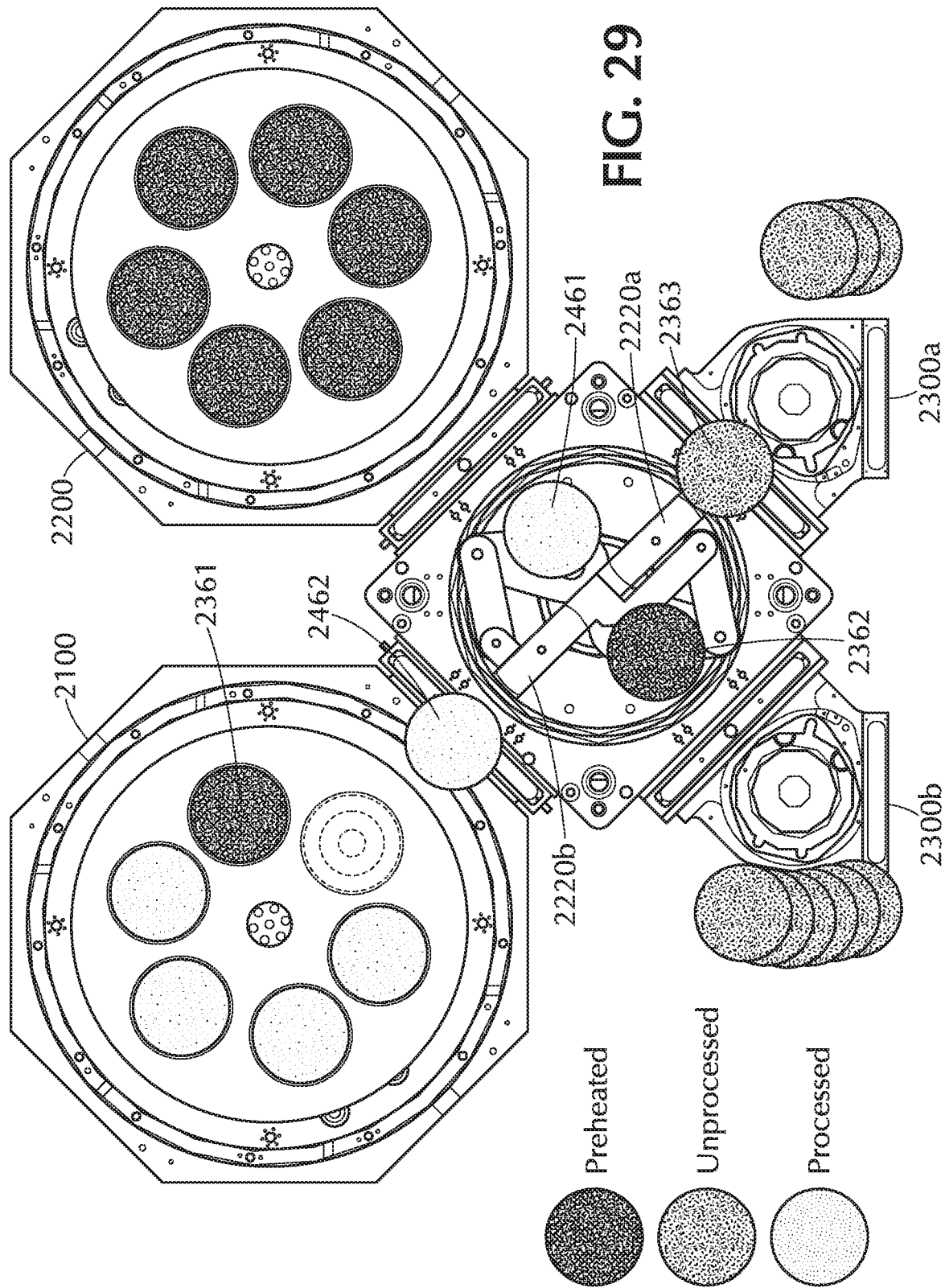
Figure 30:
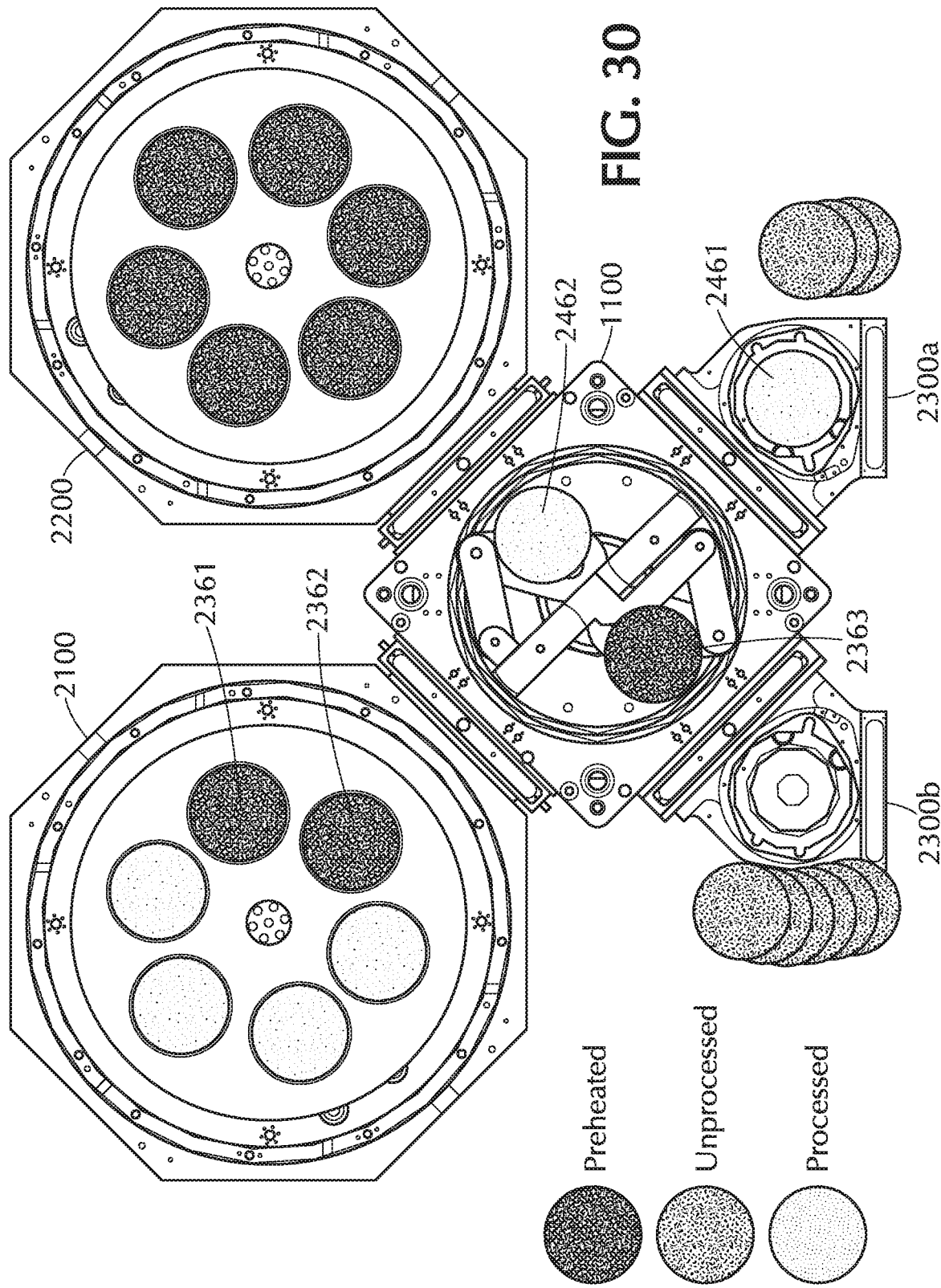

Referring to FIGS. 22 through 30, a portion of a process sequence is described. In FIG. 22, each of the wafers in the first processing chamber 2100 have been processed and the wafers are to be replaced with unprocessed wafers. In this Figure, there are no wafers in the buffer chamber 1100. In FIG. 23, robot 2220a picks up a new wafer 2361 from loadlock 2300a. In FIG. 24, the new wafer 2361 is loaded into the buffer chamber 1100 and indexed to a position between loadlock 2300a and loadlock 2300b. Once the new wafer 2361 has rotated to a position adjacent loadlock 2300b, as shown in FIG. 25, the new wafer 2361 is subjected to heat from the heating module. At the same time, robot 2220a picks up another new wafer 2362 from loadlock 2300a and robot 2220b picks up a processed wafer 2461 from the processing chamber 2100. Both wafers are loaded into the buffer chamber 1100 by retracting the robots. The carousel in the buffer chamber 1100 is indexed, as shown in FIG. 26. In FIG. 27, the carousel has been indexed again and the robot 2220b has positioned now pre-heated wafer 2361 into the processing chamber 2100. The processing chamber 2100 carousel is rotated to position another processed wafer 2462 adjacent the slit valve 1106, as in FIG. 28. FIG. 29 shows the processed wafer 2462 being removed from the processing chamber 2100 at the same time that unprocessed wafer 2363 is picked up from loadlock 2300a. In FIG. 30, the process has continued so that processing chamber 2100 now holds wafer 2361 and wafer 2362. Unprocessed wafer 2363 is still in the buffer chamber 1100 being pre-heated. Processed wafer 2461 has been unloaded from the buffer chamber 1100 into the loadlock 2300a and processed wafer 2462 is still in the buffer chamber 1100. The process will continue in this manner until all of the processed wafers have been removed from processing chamber 2100 and replaced with pre-heated unprocessed wafers from loadlock 2100a. After the wafers of processing chamber 2100 have been replaced, the robots will move so that the wafers from processing chamber 2200 can be replaced with unprocessed wafers from loadlock 2300b in the same manner.

A first embodiment of the disclosure is directed to a buffer chamber comprising: a housing with a lid, a floor and at a sidewall having at least two facets, each of the facets including a slit valve sized to allow a wafer to pass therethrough; a carousel including a wafer support having at least two wafer support positions; at least one heating module located above the carousel to heat a wafer when supported by the wafer support; a wafer transfer robot below the carousel to move a wafer between one or more areas and at least one of the wafer support positions; and a motor connected to the carousel to index the carousel so that at least one support position is aligned with a slit valve in one of the facets.

In a second embodiment, the first embodiment is modified wherein the carousel is connected to the lid of the housing. In a third embodiment, the first embodiment is modified wherein the carousel is connected to the floor of the housing.

In a fourth embodiment, any of the first through third embodiments are modified so that the wafer support of the carousel has at least one cutout to provide clearance for the wafer transfer robot.

In a fifth embodiment, any of the first through fourth embodiments are modified wherein the carousel comprises in the range of 4 and 8 wafer support positions.

In a sixth embodiment, any of the first through fifth embodiments are modified wherein each of the wafer support positions are separated from adjacent support positions by a wall.

In a seventh embodiment, any of the first through sixth embodiments are modified wherein there are four slit valves allowing access to four sides of the housing. In an eighth embodiment, the seventh embodiment is modified wherein two of the four slit valves are aligned with batch processing chambers. In a ninth embodiment, the seventh or eighth embodiment are modified wherein each batch processing chamber can process six wafers at a time. In a tenth embodiment, any of the seventh through ninth embodiments are modified wherein the carousel comprises seven support positions. In an eleventh embodiment, any of the seventh through tenth embodiments are modified wherein the carousel comprises eight support positions. In a twelfth embodiment, any of the seventh through eleventh embodiments are modified wherein a heater is positioned adjacent each of the processing chamber slit valves so that when the carousel is in an index position there is a support position located beneath each heater adjacent the processing chamber slit valves.

In a thirteenth embodiment, any of the first through twelfth embodiments are modified wherein each of the at least one heating module is independently selected from the group consisting of lamps, resistive heaters and LEDs. In a fourteenth embodiment, the thirteenth embodiment is modified wherein each of the at least one heating modules is located a distance from the carousel so that when a wafer is present, the distance is in the range of about 0.0005 inches to about 3 inches. In a fifteenth embodiment, the thirteenth or fourteenth embodiment is modified wherein at least one heating module comprises a lamp and the distance is in the range of about 20 mm and about 40 mm. In a sixteenth embodiment, any of the thirteenth through fifteenth embodiment is modified wherein at least one heating module comprises LEDs and the distance is in the range of about 5 mm to about 10 mm. In a seventeenth embodiment, any of the thirteenth through sixteenth embodiments are modified wherein at least one heating module comprises a resistive heater and the distance is less than about 1 mm.

In an eighteenth embodiment, any of the first through seventeenth embodiments are modified wherein after heating a wafer, the transfer robot can move and position the wafer in a processing chamber aligned with a slit valve in a time less than about 3 seconds. In a nineteenth embodiment, any of the first through eighteenth embodiments are modified wherein the housing has four facets.

In a twentieth embodiment, any of the first through nineteenth embodiments further comprise a primary shield located between the carousel and the transfer robot to shield the robot from the at least one heating module. In a twenty-first embodiment, the twentieth embodiment is modified wherein the primary shield comprises at least one cutout to allow a blade of the transfer robot to access the carousel. In a twenty-second embodiment any of the twentieth through twenty-first embodiment further comprise a secondary shield under the primary shield.

In a twenty-third embodiment, any of the first through twenty-second embodiments are modified wherein the carousel moves in the z-axis so that, when a wafer is present, lowering the carousel causes a wafer to remain on a blade of the transfer robot and raising the carousel lifts the wafer off of the blade of the transfer robot.

In a twenty-fourth embodiment, any of the first through twenty-third embodiments are modified wherein the transfer robot can move in along the z-axis to that a blade of the transfer robot can lift a wafer from the carousel or lower a wafer onto the carousel.

In a twenty-fifth embodiment, any of the first through twenty-fourth embodiments are modified wherein the wafer transfer robot includes a boom that supports at least one armset, each of the at least one armset having a lower arm attached to the boom at a shoulder, an upper arm attached to the lower arm at an elbow and a blade attached to the upper arm at a wrist, so that the blade is on top of the upper arm, the upper arm is on top of the lower arm and the lower arm is on top of the boom and no part of the transfer robot extends above the blade interfering with the carousel.

In a twenty-sixth embodiment, the twenty-fifth embodiment is modified wherein the transfer robot is a short armset robot on a long boom so that the combined length of the armset from shoulder to an end of the blade has a length that is up to about 2.5 times a length from a pivot point of the boom to the shoulder. In a twenty-seventh embodiment, the twenty-fifth embodiment is modified wherein the transfer robot is a long armset robot on a short boom so that the combined length of the armset from should to an end of the blade has a length that is greater than about 2.5 times a length from a pivot point of the boom to the shoulder.

In a twenty-eighth embodiment, the twenty-fifth embodiment is modified wherein the boom is L-shaped and has an armset at an end of each leg of the boom, each armset extending along an axis of the leg of the boom so that in a retracted position the blade is parallel to and positioned over the leg of the boom with the wrist adjacent an angled portion of the L-shaped boom. In a twenty-ninth embodiment, the twenty-eighth embodiment is modified wherein the transfer robot includes a pulley which causes the shoulder, elbow and wrist to extend substantially simultaneously so that the blade remains parallel to the leg during extension.

In a thirtieth embodiment, the twenty-fifth embodiment is modified wherein the boom is X-shaped and has an armset at an end of each leg of the boom, each armset extending along an axis of the leg of the boom so that in a retracted position the blade is parallel to and positioned over the leg of the boom with the wrist adjacent a central portion of the X-shaped boom. In a thirty-first embodiment, the thirtieth embodiment is modified wherein the transfer robot includes a pulley which causes the shoulder, elbow and wrist to extend so that the blade remains parallel to the leg during extension.

In a thirty-second embodiment, the twenty fifth embodiment is modified wherein the boom is I-shaped and has an armset at an end of each end of the boom, each armset extending along an axis of the boom so that in a retracted position the blade is parallel to and positioned over the boom with the wrist adjacent a central portion of the I-shaped boom. In a thirty-third embodiment, the thirty-second embodiment is modified wherein the transfer robot includes a pulley which causes the shoulder, elbow and wrist to extend so that the blade remains parallel to the boom during extension.

In a thirty-fourth embodiment, the twenty-second embodiment is modified wherein the boom is I-shaped and positioned at 45° to a major axis of the movement of the blade. In a thirty-fifth embodiment, the thirty-fourth embodiment is modified wherein the blade is offset so that a majority of the blade lies along the major axis of the movement and a portion of the blade adjacent the wrist lies at 45° to the major axis, so that upon full extension of the armset, the lower arm, upper arm, shoulder, elbow and wrist are parallel to and offset from the major axis.

In a thirty-sixth embodiment, the twenty-seventh embodiment is modified wherein the boom is L-shaped and has an armset at an end of each leg of the boom, each armset extending along an axis of the leg of the boom so that in a retracted position the blade is parallel to and positioned over the leg of the boom with the wrist adjacent an angled portion of the L-shaped boom. In a thirty-seventh embodiment, the thirty-sixth embodiment is modified wherein the transfer robot includes a pulley which causes the shoulder, elbow and wrist to extend substantially simultaneously so that the blade remains parallel to the leg during extension.

In a thirty-eighth embodiment, any of the first through twenty-fourth embodiment are modified wherein the wafer transfer robot comprises: a base; a first armset comprising a first lower arm connected to the base at a first shoulder, a first upper arm connected to the first lower arm at a first elbow, a first blade connected the first upper arm at a first wrist, the first blade having a first inner blade portion extending a first length from the first wrist to a first lower corner, a first intermediate blade portion extending perpendicularly from the first inner blade portion to a first upper corner and a first outer blade portion extending perpendicular to the first intermediate blade portion in a direction away from and parallel to the first inner blade portion; and a second armset comprising a second lower arm connected to the base at a second shoulder, a second upper arm connected to the second lower arm at a second elbow, a second blade connected to the second upper arm at a second wrist, the second blade having a second inner blade portion extending a second length from the second wrist to a second lower corner, a second intermediate blade portion extending perpendicularly from the second inner blade portion to a second upper corner and a second outer blade portion extending perpendicularly to the second intermediate blade portion in a direction away from and parallel to the second inner blade portion, wherein the first length is greater than the second length and the first outer blade portion and the second outer blade portion can support wafers substantially coplanarly.

In a thirty-ninth embodiment, the thirty-eighth embodiment is modified wherein the second armset cannot extend until the first armset has extended and the first armset cannot retract until the second armset has retracted. In a fortieth embodiment, any of the thirty-eighth through thirty-ninth embodiments are modified wherein the base is rotatable.

In a forty-first embodiment, any of the first through twenty-fourth embodiments are modified wherein the wafer transfer robot comprises: a boom having an I-shape with a first end and a second end; a first armset comprising a first lower arm connected to the boom at a first shoulder at the first end of the boom, a first upper arm connected to the first lower arm at a first elbow, a first blade connected the first upper arm at a first wrist, the first blade having a first inner blade portion extending a first length from the first wrist to a first lower corner, a first intermediate blade portion extending perpendicularly from the first inner blade portion to a first upper corner and a first outer blade portion extending perpendicular to the first intermediate blade portion in a direction away from and parallel to the first inner blade portion; and a second armset comprising a second lower arm connected to the boom at a second shoulder at the second end of the boom, a second upper arm connected to the second lower arm at a second elbow, a second blade connected to the second upper arm at a second wrist, the second blade having a second inner blade portion extending a second length from the second wrist to a second lower corner, a second angled blade portion extending at an angle to and along the plane of the second inner blade portion, a second intermediate blade portion extending perpendicularly from the second angled blade portion to a second upper corner and a second outer blade portion extending in a plane perpendicular to the second intermediate blade portion in a direction away from, parallel to and offset from the second inner blade portion, wherein when in the retracted position, the second outer blade portion is above the first inner blade portion and the first outer blade portion is above and offset from the second inner blade portion, and the first outer blade portion and the second outer blade portions are substantially coplanar.

In a forty-second embodiment, the forty-first embodiment is modified wherein when the armset is extended through a slit valve to place a wafer into a processing chamber, the wrist of the armset does not extend completely into the processing chamber.

A forty-third embodiment is directed to a wafer transfer robot comprising: an L-shaped boom having a first leg with a first end, a second leg with a second end, the first leg and second leg connected at an angled portion; an armset attached to each of the first end and second send of the boom, each armset having a lower arm attached to the boom at a shoulder adjacent the first end or second end, an upper arm attached to the lower arm at an elbow and a blade attached to the upper arm at a wrist; and a pulley which causes the shoulder, elbow and wrist to extend substantially simultaneously so that the blade remains parallel to the leg during extension, wherein the transfer is a short armset robot on a long boom so that the combined length of the armset from shoulder to an end of the blade has a length that is up to about 2.5 times a length from a pivot point in the angled portion of the boom to the shoulder.

A forty-fourth embodiment is directed to a wafer transfer robot comprising: an L-shaped boom having a first leg with a first end, a second leg with a second end, the first leg and second leg connected at an angled portion; an armset attached to each of the first end and second send of the boom, each armset having a lower arm attached to the boom at a shoulder adjacent the first end or second end, an upper arm attached to the lower arm at an elbow and a blade attached to the upper arm at a wrist; and a pulley which causes the shoulder, elbow and wrist to extend substantially simultaneously so that the blade remains parallel to the leg during extension, wherein the transfer is a long armset robot on a short boom so that the combined length of the armset from should to an end of the blade has a length that is greater than about 2.5 times a length from a pivot point in the angled portion of the boom to the shoulder.

A forty-fifth embodiment is directed to a wafer transfer robot comprising: an I-shaped boom having a first end, a second end and a pivot point; an armset attached to each of the first end and second send of the boom, each armset having a lower arm attached to the boom at a shoulder adjacent the first end or second end, an upper arm attached to the lower arm at an elbow and a blade attached to the upper arm at a wrist; and a pulley which causes the shoulder, elbow and wrist to extend substantially simultaneously so that the blade remains parallel to the leg during extension, wherein the transfer is a long armset robot on a short boom so that the combined length of the armset from should to an end of the blade has a length that is greater than about 2.5 times a length from a pivot point in the angled portion of the boom to the shoulder, and the boom is positioned at an angle in the range of about 30° to about 60° relative to a major axis of the movement of the blades.

In a forty-sixth embodiment, the forty-fifth embodiment is modified wherein each blade is offset so that a majority of the blade lies along the major axis of movement and a portion of the blade adjacent the wrist lies at 45° to the major axis, so that upon full extension of the armset, the lower arm, upper arm, shoulder, elbow and wrist are parallel to and offset from the major axis.

A forty-seventh embodiment is directed to a wafer transfer robot comprising: a rotatable base; a first armset comprising a first lower arm connected to the base at a first shoulder, a first upper arm connected to the first lower arm at a first elbow, a first blade connected the first upper arm at a first wrist, the first blade having a first inner blade portion extending a first length from the first wrist to a first lower corner, a first intermediate blade portion extending perpendicularly from the first inner blade portion to a first upper corner and a first outer blade portion extending perpendicular to the first intermediate blade portion in a direction away from and parallel to the first inner blade portion; and a second armset comprising a second lower arm connected to the base at a second shoulder, a second upper arm connected to the second lower arm at a second elbow, a second blade connected to the second upper arm at a second wrist, the second blade having a second inner blade portion extending a second length from the second wrist to a second lower corner, a second intermediate blade portion extending perpendicularly from the second inner blade portion to a second upper corner and a second outer blade portion extending perpendicularly to the second intermediate blade portion in a direction away from and parallel to the second inner blade portion, wherein the first length is greater than the second length and the first outer blade portion and the second outer blade portion can support wafers substantially coplanarly, and the second armset cannot extend until the first armset has extended and the first armset cannot retract until the second armset has retracted.

A forty-eighth embodiment is directed to a wafer transfer robot comprising: a rotatable boom having an I-shape with a first end and a second end; a first armset comprising a first lower arm connected to the boom at a first shoulder at the first end of the boom, a first upper arm connected to the first lower arm at a first elbow, a first blade connected the first upper arm at a first wrist, the first blade having a first inner blade portion extending a first length from the first wrist to a first lower corner, a first intermediate blade portion extending perpendicularly from the first inner blade portion to a first upper corner and a first outer blade portion extending perpendicular to the first intermediate blade portion in a direction away from and parallel to the first inner blade portion; and a second armset comprising a second lower arm connected to the boom at a second shoulder at the second end of the boom, a second upper arm connected to the second lower arm at a second elbow, a second blade connected to the second upper arm at a second wrist, the second blade having a second inner blade portion extending a second length from the second wrist to a second lower corner, a second angled blade portion extending at an angle to and along the plane of the second inner blade portion, a second intermediate blade portion extending perpendicularly from the second angled blade portion to a second upper corner and a second outer blade portion extending in a plane perpendicular to the second intermediate blade portion in a direction away from, parallel to and offset from the second inner blade portion, wherein when in the retracted position, the second outer blade portion is above the first inner blade portion and the first outer blade portion is above and offset from the second inner blade portion, and the first outer blade portion and the second outer blade portions are substantially coplanar.

A forty-ninth embodiment is directed to a cluster tool comprising a buffer chamber according to any of the first through forty-second embodiment having four facets; a first batch processing chamber connected to one of the four facets; a second batch processing chamber connected to a second of the four facets, next to the first of the four facets; and a first loading station and a second loading station attached to the third facet and fourth facet of the buffer chamber, wherein each of the first batch processing chamber and the second batch processing chamber can process n wafers at the same time and the buffer chamber has a carousel with n+1 or n+2 support positions.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A wafer transfer robot comprising:
   a L-shaped boom having a first leg with a first end, a second leg with a second end, the first leg and second leg connected at an angled portion;
   an armset attached to each of the first end and second end of the boom, each armset having a lower arm attached to the boom at a shoulder adjacent the first end or second end, an upper arm attached to the lower arm at an elbow and a blade attached to the upper arm at a wrist; and
   a pulley which causes the shoulder, elbow and wrist to extend substantially simultaneously so that the blade remains parallel to the leg during extension.

2. The wafer transfer robot of claim 1, wherein the transfer robot is a short armset robot on a long boom so that a combined length of the armset from shoulder to an end of the blade has a length that is up to about 2.5 times a length from a pivot point in the angled portion of the boom to the shoulder.

3. The wafer transfer robot of claim 2, wherein the wafer transfer robot can use z-axis movement to lift a wafer on/off a carousel and place the wafer to a facet position.

4. The wafer transfer robot of claim 1, wherein the transfer robot is a long armset robot on a short boom so that the combined length of the armset from shoulder to an end of the blade has a length that is greater than about 2.5 times a length from a pivot point in the angled portion of the boom to the shoulder.

5. The wafer transfer robot of claim 4, wherein the long armset robot on a short boom has an armset length greater than about 3.5 times the length from the pivot point in the angled portion of the boom to the shoulder.

6. The wafer transfer robot of claim 4, wherein the wafer transfer robot can use z-axis movement to lift a wafer on/off a carousel and place the wafer to a facet position.

7. A wafer transfer robot comprising:
   an I-shaped boom having a first end, a second end and a pivot point;
   an armset attached to each of the first end and second end of the boom, each armset having a lower arm attached to the boom at a shoulder adjacent the first end or second end, an upper arm attached to the lower arm at an elbow and a blade attached to the upper arm at a wrist; and
   a pulley which causes the shoulder, elbow and wrist to extend substantially simultaneously so that the blade remains parallel to the I-shaped boom leg during extension.

8. The wafer transfer robot of claim 7, wherein the transfer robot is a long armset robot on a short boom so that the combined length of the armset from should to an end of the blade has a length that is greater than about 2.5 times a length from the pivot point in the angled portion of the boom to the shoulder, and the boom is positioned at an angle in the range of about 30° to about 60° relative to a major axis of the movement of the blades.

9. The wafer transfer robot of claim 8, wherein the long armset robot on a short boom has an armset length greater than about 3.5 times the length from the pivot point in the angled portion of the boom to the shoulder.

10. The wafer transfer robot of claim 7, wherein each blade is offset so that a majority of the blade lies along the major axis of movement and a portion of the blade adjacent the wrist lies at 45° to the major axis, so that upon full extension of the armset, the lower arm, upper arm, shoulder, elbow and wrist are parallel to and offset from the major axis.

11. The wafer transfer robot of claim 8, wherein the wafer transfer robot can use z-axis movement to lift a wafer on/off a carousel and place the wafer to a facet position.

\* \* \* \* \*

UNITED STATES PATENT AND TRADEMARK OFFICE
CERTIFICATE OF CORRECTION

| | |
|---|---|
| PATENT NO. | : 11,264,258 B2 |
| APPLICATION NO. | : 16/877641 |
| DATED | : March 1, 2022 |
| INVENTOR(S) | : Weaver et al. |

It is certified that error appears in the above-identified patent and that said Letters Patent is hereby corrected as shown below:

In the Specification

• Column 10, Line 07, replace "2×" before "arm" and after "many" with "2X".

In the Claims

• Column 20, Line 46, replace "Claim 4," before "wherein" and after "robot of" with "Claim 1".

• Column 20, Line 64, remove "leg" before "during" and after "boom".

Signed and Sealed this
Seventh Day of June, 2022

Katherine Kelly Vidal
*Director of the United States Patent and Trademark Office*